US012080378B2

(12) United States Patent
García Redondo et al.

(10) Patent No.: US 12,080,378 B2
(45) Date of Patent: Sep. 3, 2024

(54) CIRCUITS AND METHODS OF DETECTING AT LEAST PARTIAL BREAKDOWN OF CANARY CIRCUITS

(71) Applicant: Arm Limited, Cambridge (GB)

(72) Inventors: Fernando García Redondo, Cambridge (GB); Pranay Prabhat, Cambridge (GB); Mudit Bhargava, Austin, TX (US); Supreet Jeloka, Austin, TX (US)

(73) Assignee: Arm Limited, Cambridge (GB)

( * ) Notice: Subject to any disclaimer, the term of this patent is extended or adjusted under 35 U.S.C. 154(b) by 80 days.

(21) Appl. No.: 17/709,076

(22) Filed: Mar. 30, 2022

(65) Prior Publication Data

US 2023/0317126 A1    Oct. 5, 2023

(51) Int. Cl.
| | | |
|---|---|---|
| *G11C 7/12* | (2006.01) | |
| *G11C 5/12* | (2006.01) | |
| *G11C 7/16* | (2006.01) | |
| *G11C 7/18* | (2006.01) | |
| *G11C 8/08* | (2006.01) | |

(52) U.S. Cl.
CPC .............. *G11C 7/12* (2013.01); *G11C 5/12* (2013.01); *G11C 7/16* (2013.01); *G11C 7/18* (2013.01); *G11C 8/08* (2013.01)

(58) Field of Classification Search
CPC .... G11C 7/12; G11C 5/12; G11C 7/16; G11C 7/18; G11C 8/08
USPC ........................................................ 365/203
See application file for complete search history.

(56) References Cited

U.S. PATENT DOCUMENTS

| | | | |
|---|---|---|---|
| 2013/0128679 A1* | 5/2013 | Kurjanowicz | G06F 11/1048 365/200 |
| 2015/0029799 A1* | 1/2015 | Schreiber | G11C 8/08 365/201 |
| 2019/0325961 A1* | 10/2019 | Jaiswal | G11C 11/1657 |
| 2019/0342106 A1* | 11/2019 | Li | G11C 7/24 |
| 2020/0185457 A1* | 6/2020 | Sharma | H10N 70/021 |
| 2020/0350002 A1* | 11/2020 | Singh | G11C 5/025 |
| 2023/0230624 A1* | 7/2023 | Wu | G11C 16/10 365/189.011 |

OTHER PUBLICATIONS

Amrouch, et al.; Connecting the Physical and Application Level Towards Grasping Aging Effects; 2015 IEEE International Reliability Physics Symposium; Apr. 2015.

(Continued)

*Primary Examiner* — Huan Hoang
*Assistant Examiner* — Minh Dinh
(74) *Attorney, Agent, or Firm* — Pramudji Law Group PLLC; Ari Pramudji

(57) ABSTRACT

According to one implementation of the present disclosure, a circuit comprises: a memory array comprising one or more groupings of bitcells, one or more bitlines, and one or more wordlines; and one or more canary circuits coupled to the memory array, wherein each of the canary circuits is configured to predict at least partial breakdown of a corresponding grouping of bitcells in the memory array. According to one implementation of the present disclosure, a method includes: providing an excitation stress on one or more canary circuits corresponding to a grouping of bitcells in a memory array; detecting at least a partial breakdown of the one or more canary circuits; and generating a flag.

19 Claims, 22 Drawing Sheets

(56) References Cited

OTHER PUBLICATIONS

Martin-Martinez, et al.; Circuit Design-Oriented Stochastic Piecewise Modeling of the Postbreakdown Gate Current in MOSFETs : Application to Ring Oscillators; IEEE Transactions On Device And Materials Reliability; vol. 12. No. 1; pp. 78-85; Mar. 2012.

Suñé, et al.; Reversible Dielectric Breakdown of Thin Gate Oxides in MOS Devices; Microelectronics Reliability; vol. 33, iss 7; pp. 1031-1039; May 1993. https://doi.org/10.1016/0026-2714(93)90299-E.

* cited by examiner

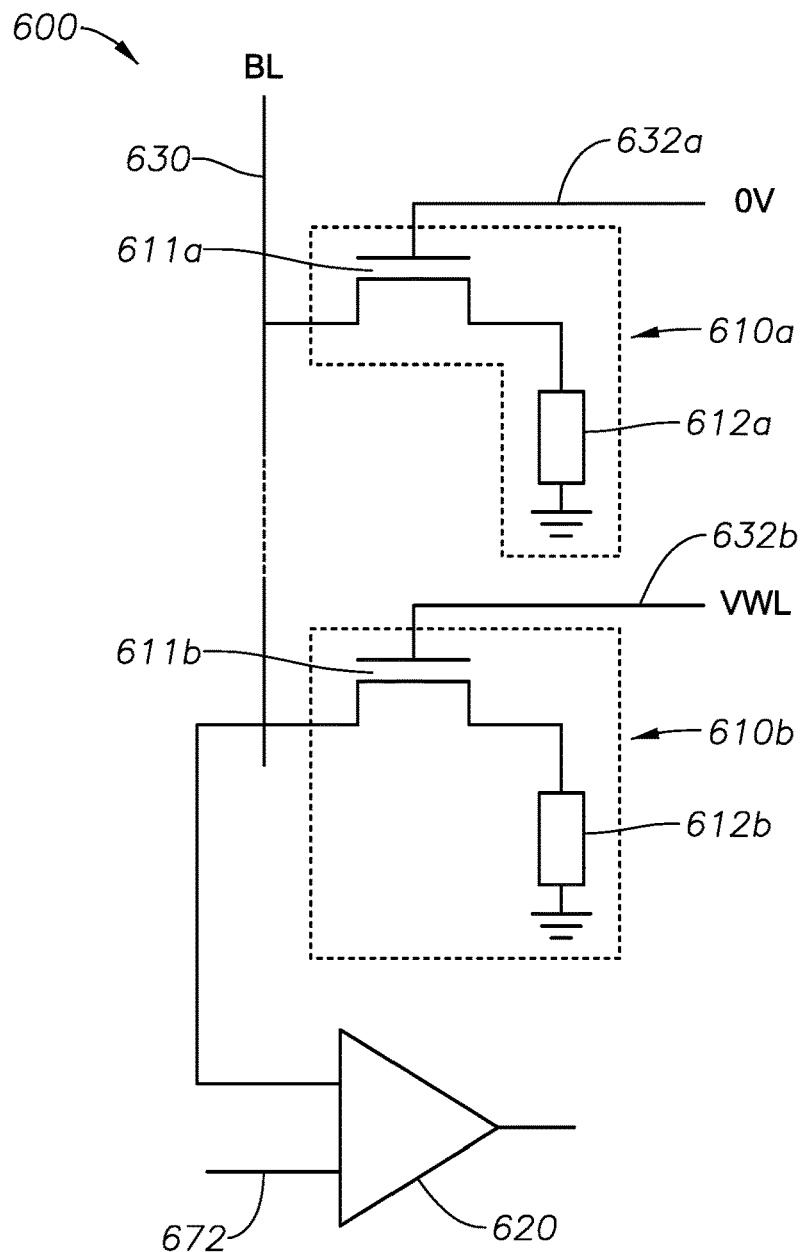
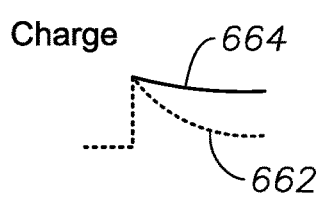
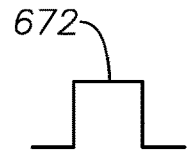
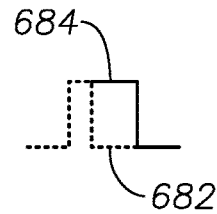
FIG. 6A
FIG. 6B      FIG. 6C      FIG. 6D

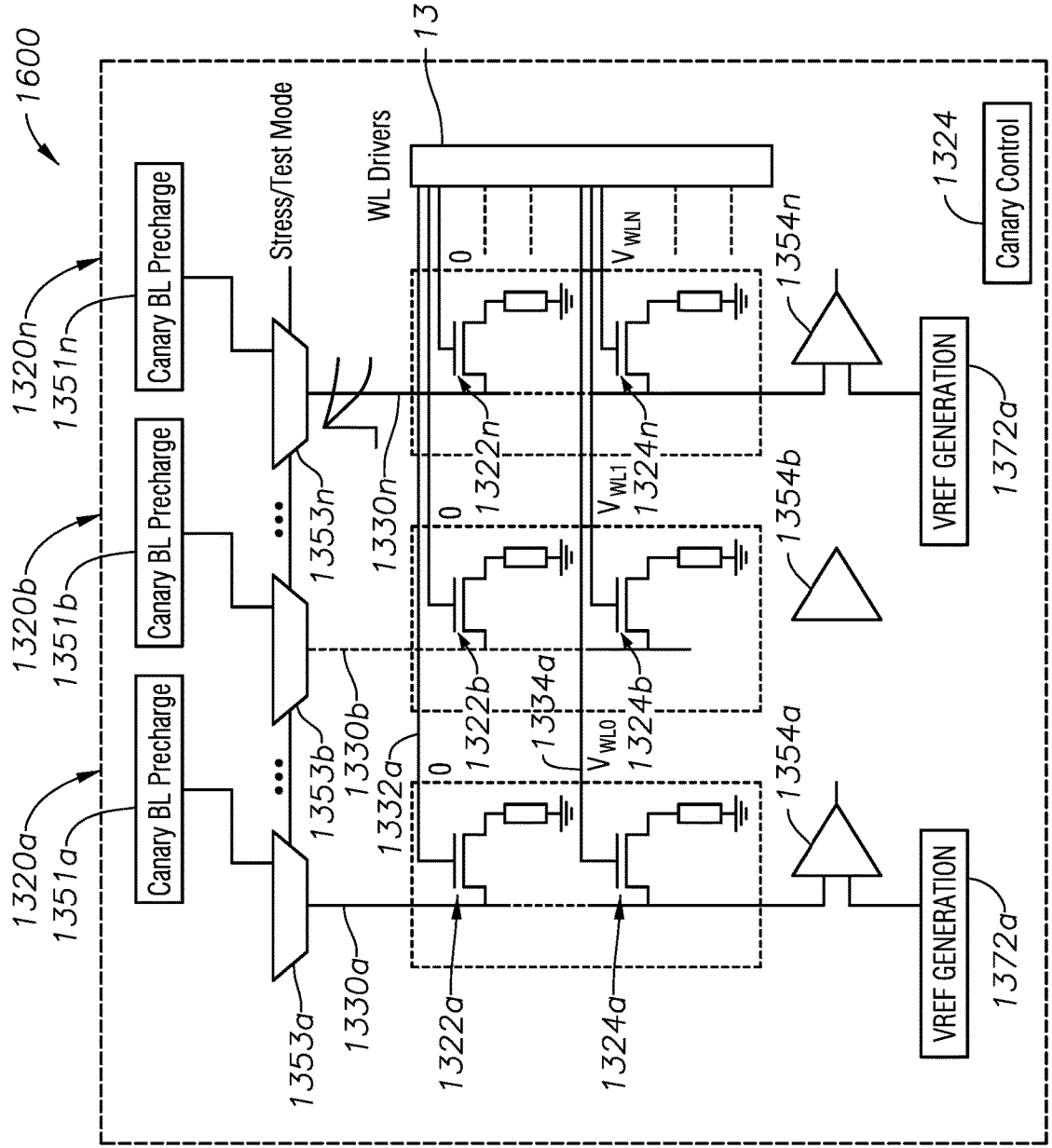
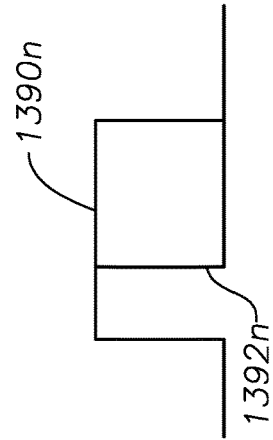
FIG. 16A
FIG. 16B
FIG. 16C

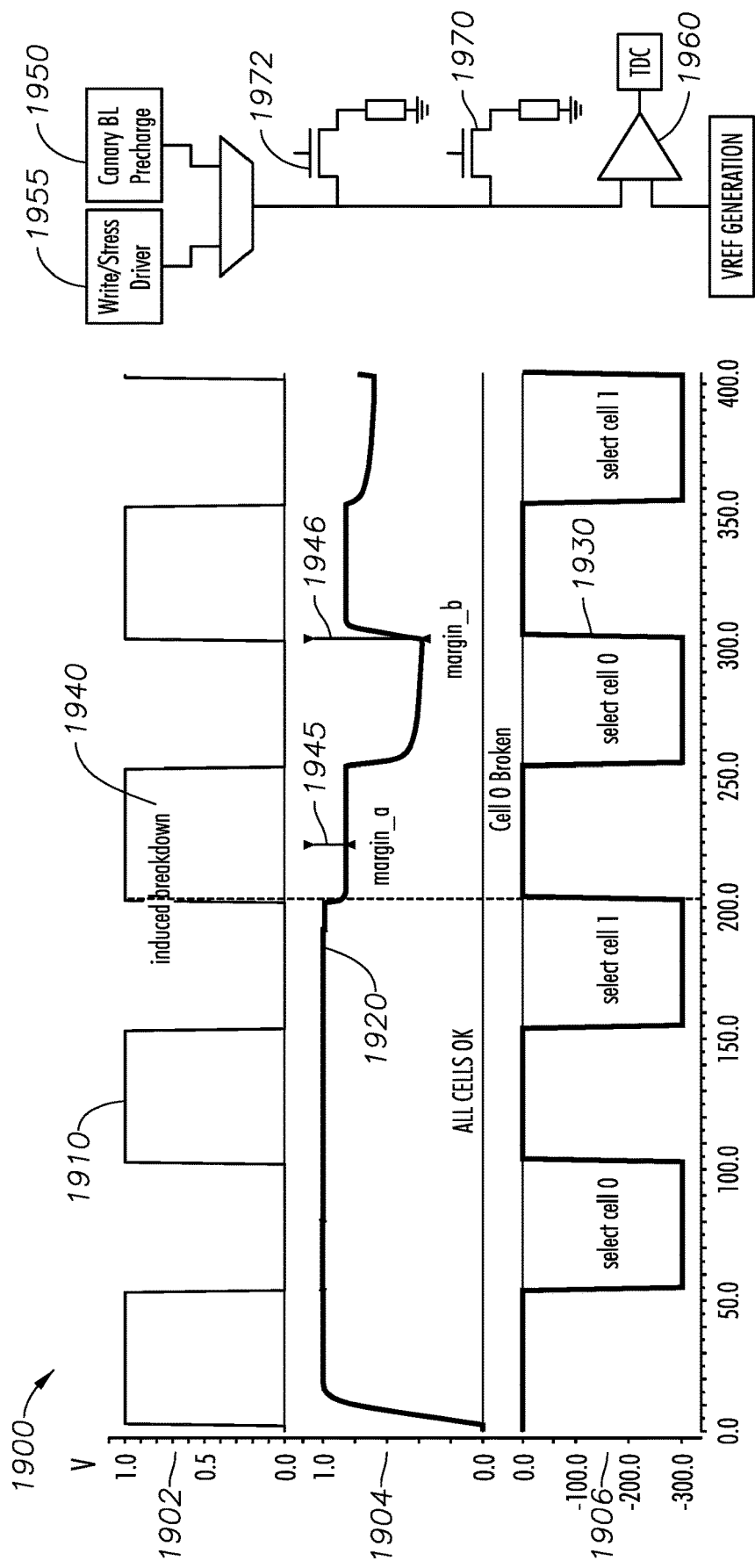

CIRCUITS AND METHODS OF DETECTING AT LEAST PARTIAL BREAKDOWN OF CANARY CIRCUITS

I. FIELD

The present disclosure is generally related to circuits and methods of detecting at least partial breakdown of canary circuits.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater area efficiency for memory storage capacity and read/write capabilities.

As memory can be the biggest area constraint on semi-conductor chips, there is an ongoing requirement for circuitry and memory operation to always work at optimal efficiency and reliability. When in operation, access transistors of memory devices when utilized over time are subject to degradation. Such degradation may occur sooner based on the quantity and duration of voltage applied to such transistors. Hence, to maintain peak operability, there is a need in the art to predict when such access transistors are likely to undergo degradation and failure, so as to take measures to protect data stored on the memory devices.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

FIG. 6A is a schematic diagram of a portion of an example circuit in accordance with various implementations described herein.

FIGS. 6B-6D are operational graphs including waveforms corresponding to portions of FIG. 6A.

Figure 10:
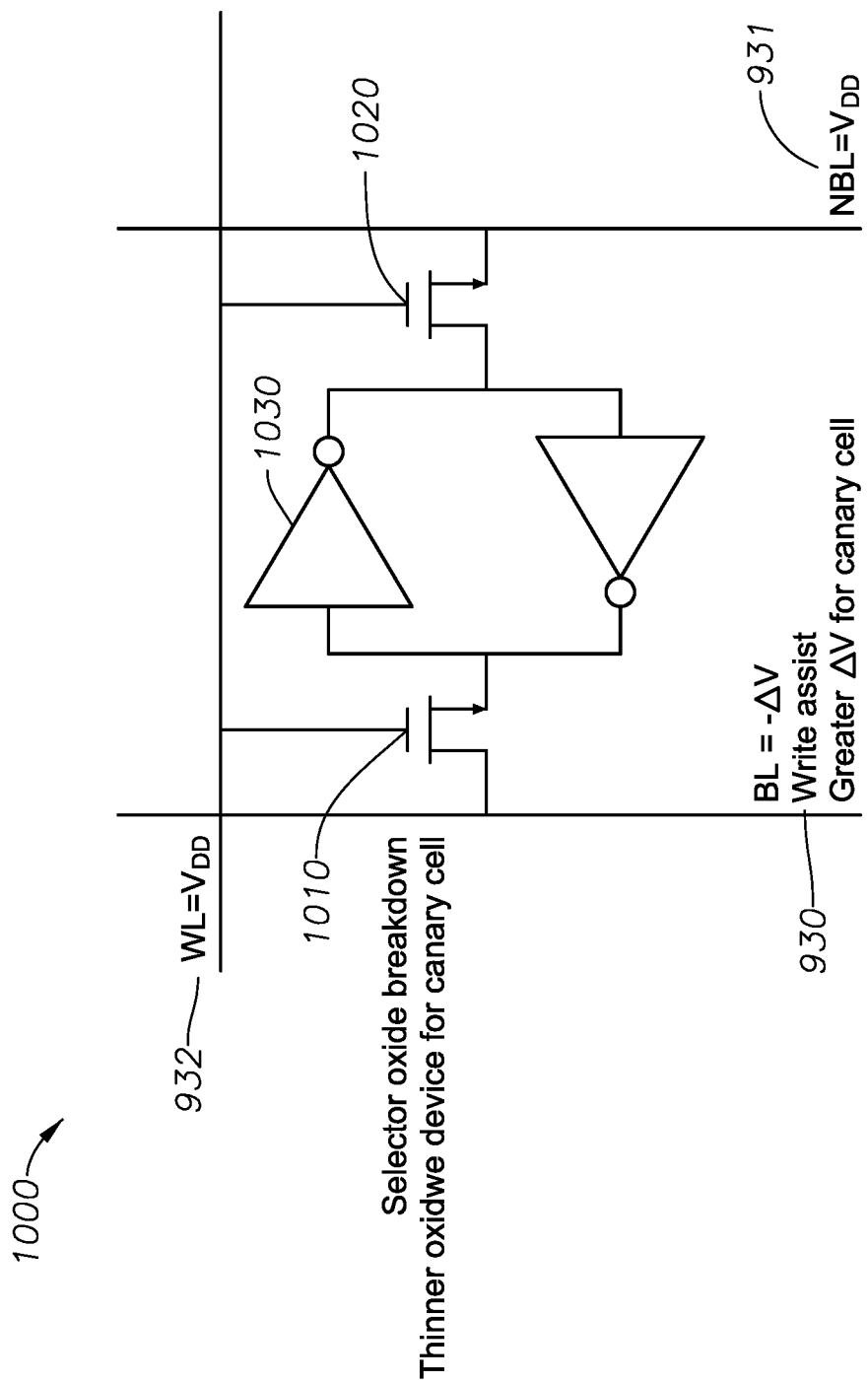
Figure 11:
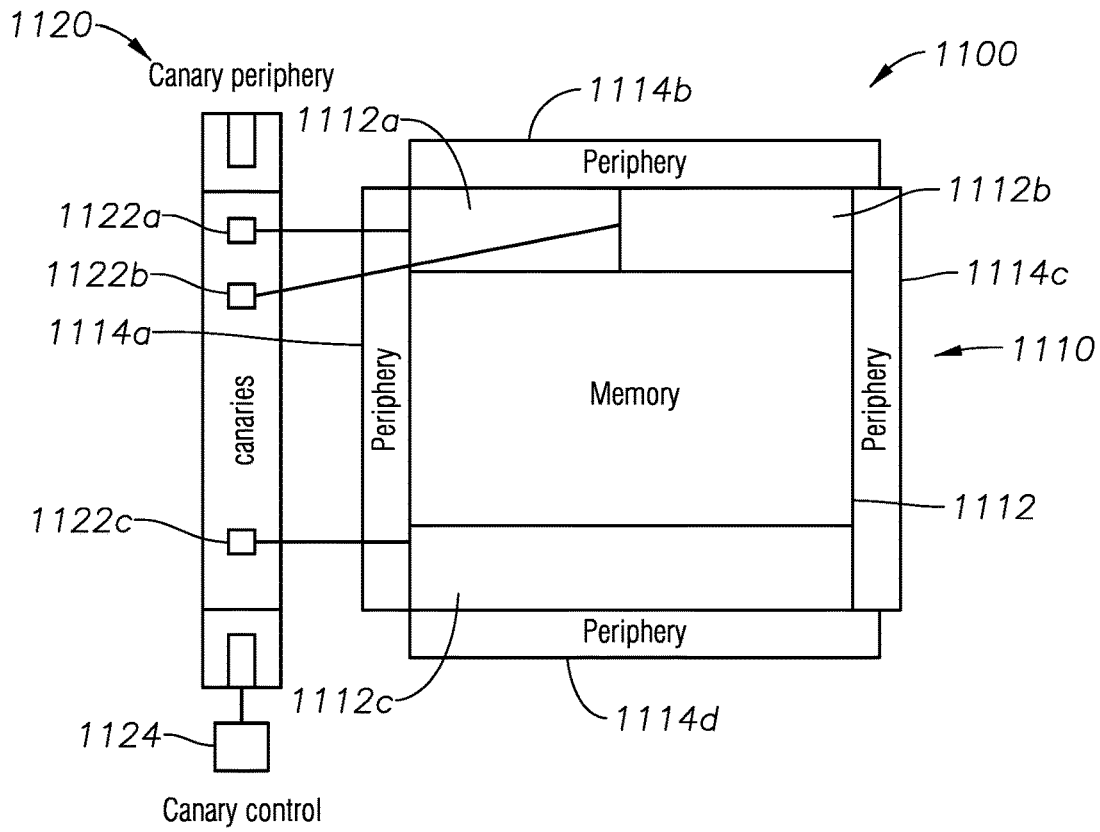
Figure 12:
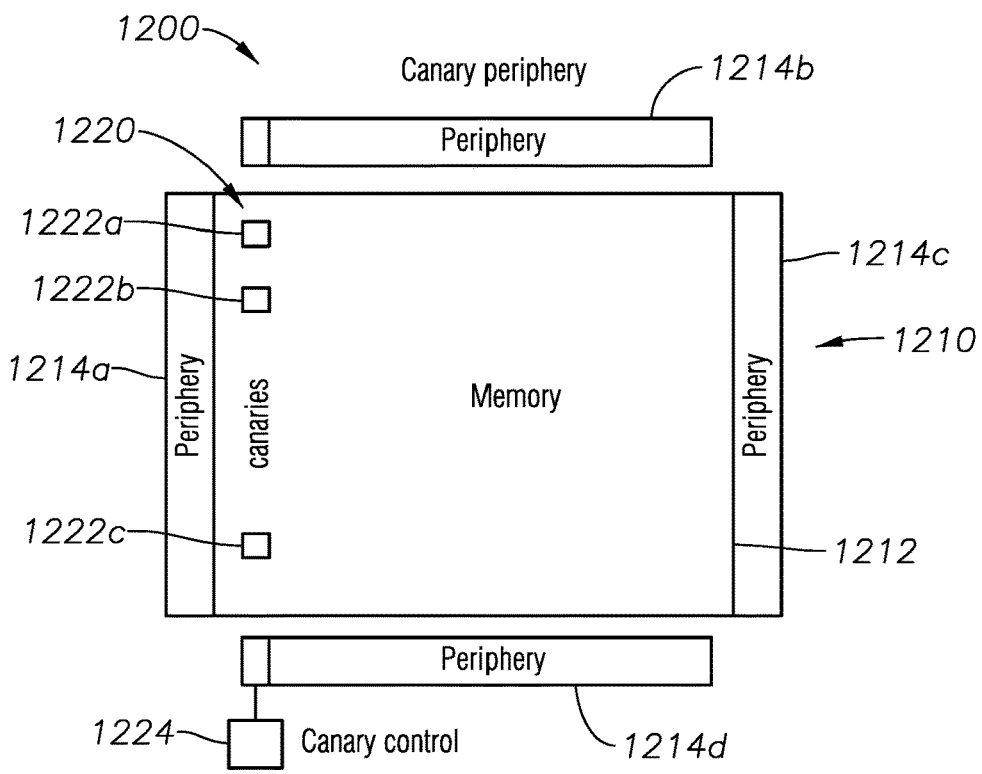
Figure 13:
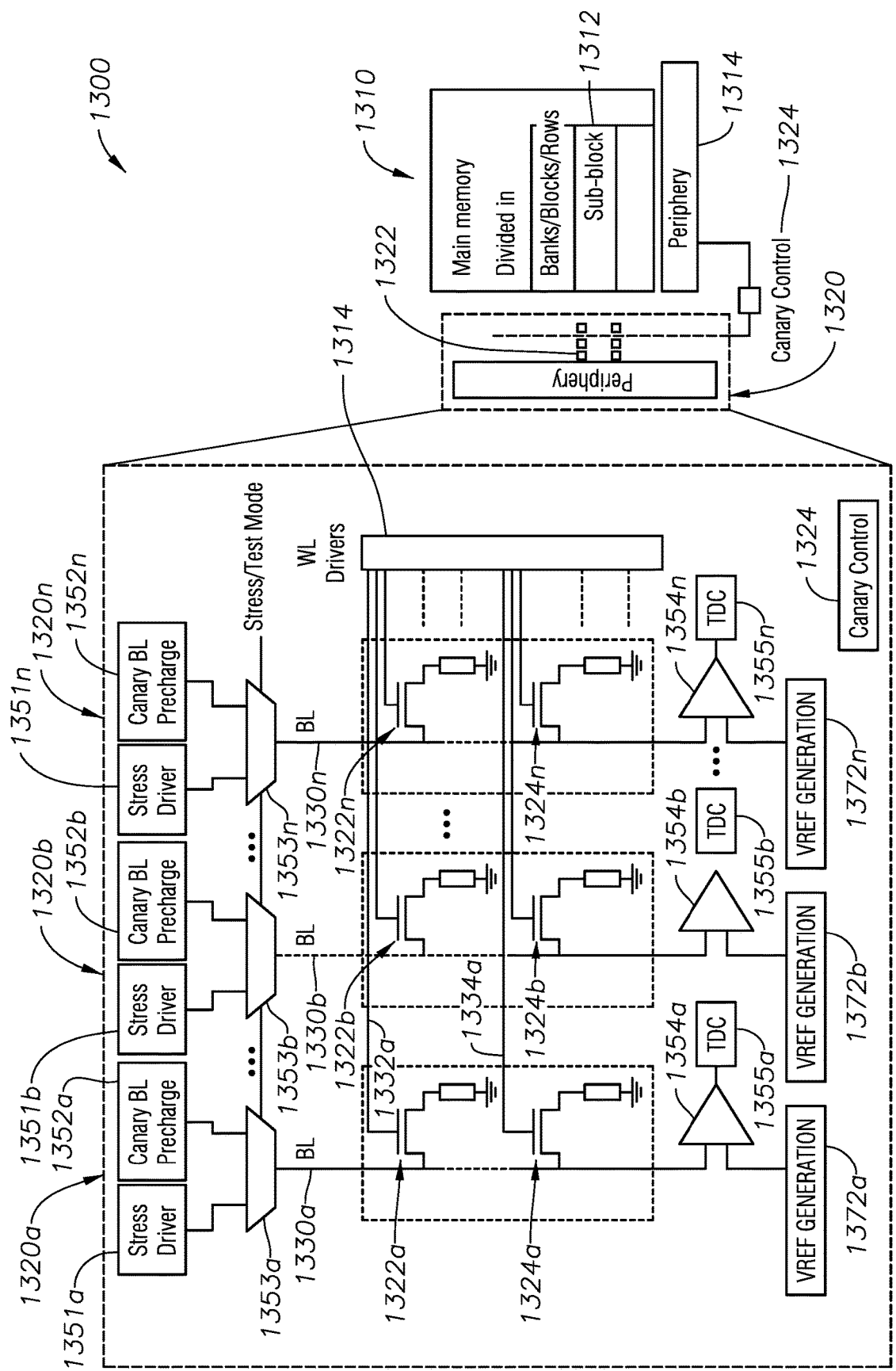
Figure 14:
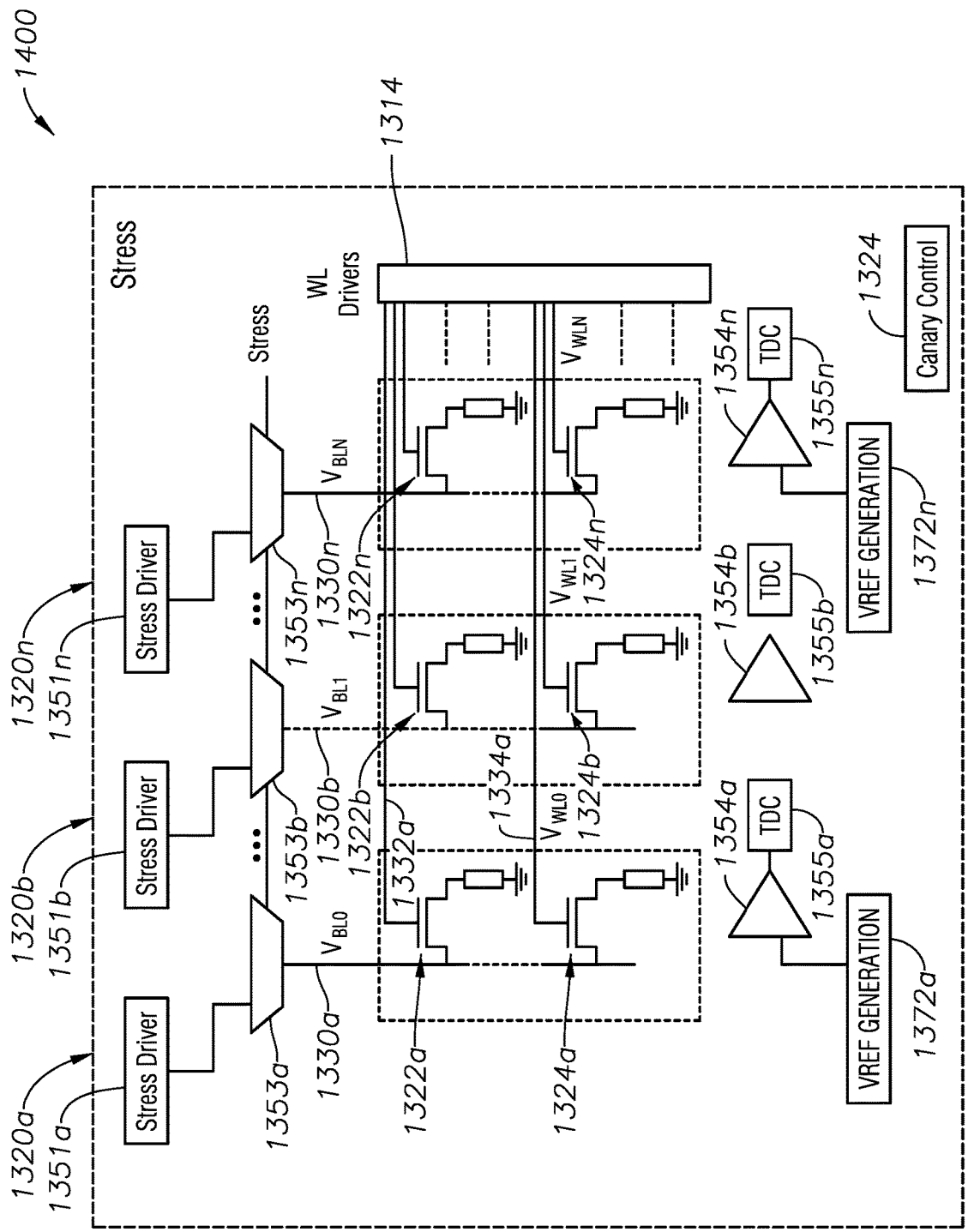
Figure 15B:
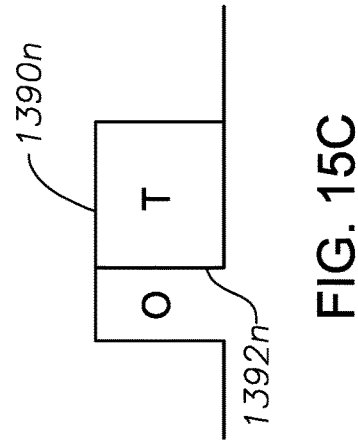
Figure 15C:
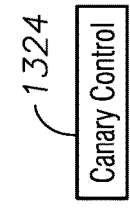
Figure 15A:
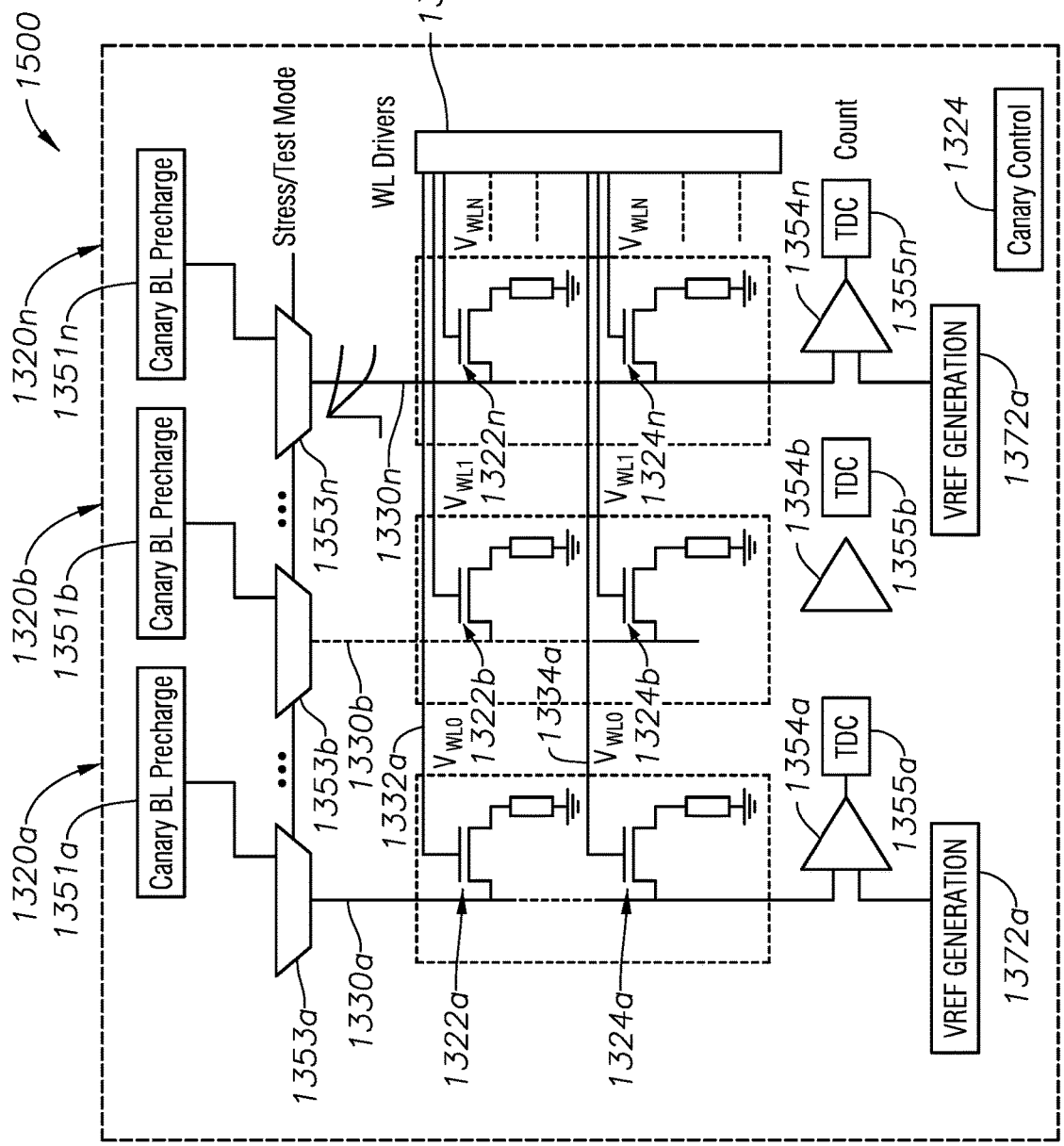

FIG. 10 is a schematic diagram of a portion of an example circuit in accordance with various implementations described herein FIG. 11 is a schematic diagram of a portion of an example circuit in accordance with various implementations described herein FIG. 12 is a schematic diagram of a portion of an example circuit in accordance with various implementations described herein FIG. 13 is a schematic diagram of a portion of an example circuit in accordance with various implementations described herein FIG. 14 is a schematic diagram of a portion of an example circuit in accordance with various implementations described herein FIG. 15A is a schematic diagram of a portion of an example circuit in accordance with various implementations described herein.

FIGS. 15B-15C are operational graphs including waveforms corresponding to portions of FIG. 15A.

FIG. 16A is a schematic diagram of a portion of an example circuit in accordance with various implementations described herein.

FIGS. 16B-16C are operational graphs including waveforms corresponding to portions of FIG. 16A.

Figures 17A, 17B:
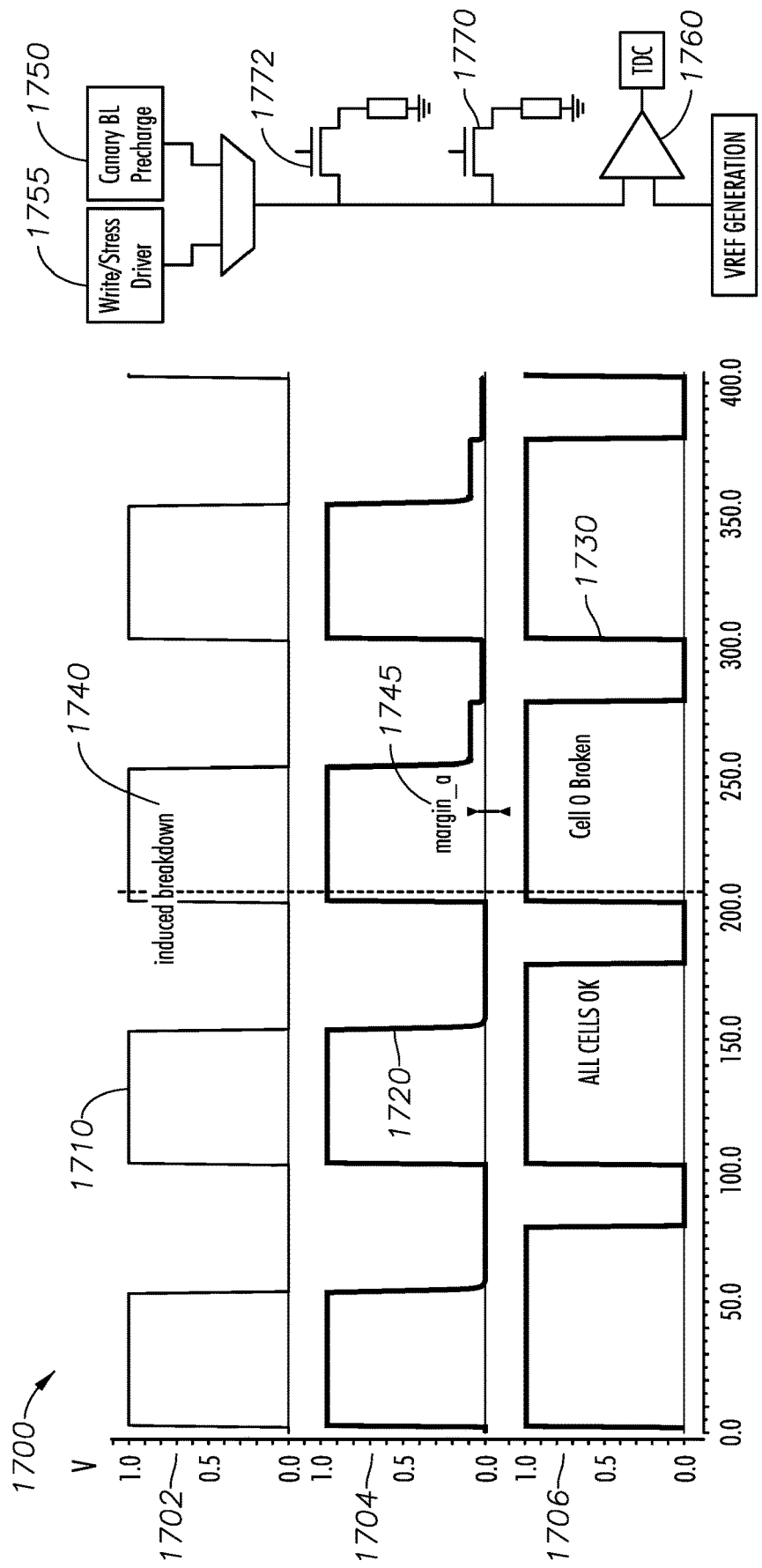

FIG. 17A is a operational graph including waveforms in accordance with various implementations described herein.

FIG. 17B is a schematic diagram of a portion of an example circuit corresponding to portions of FIG. 17A.

Figures 18A, 18B:
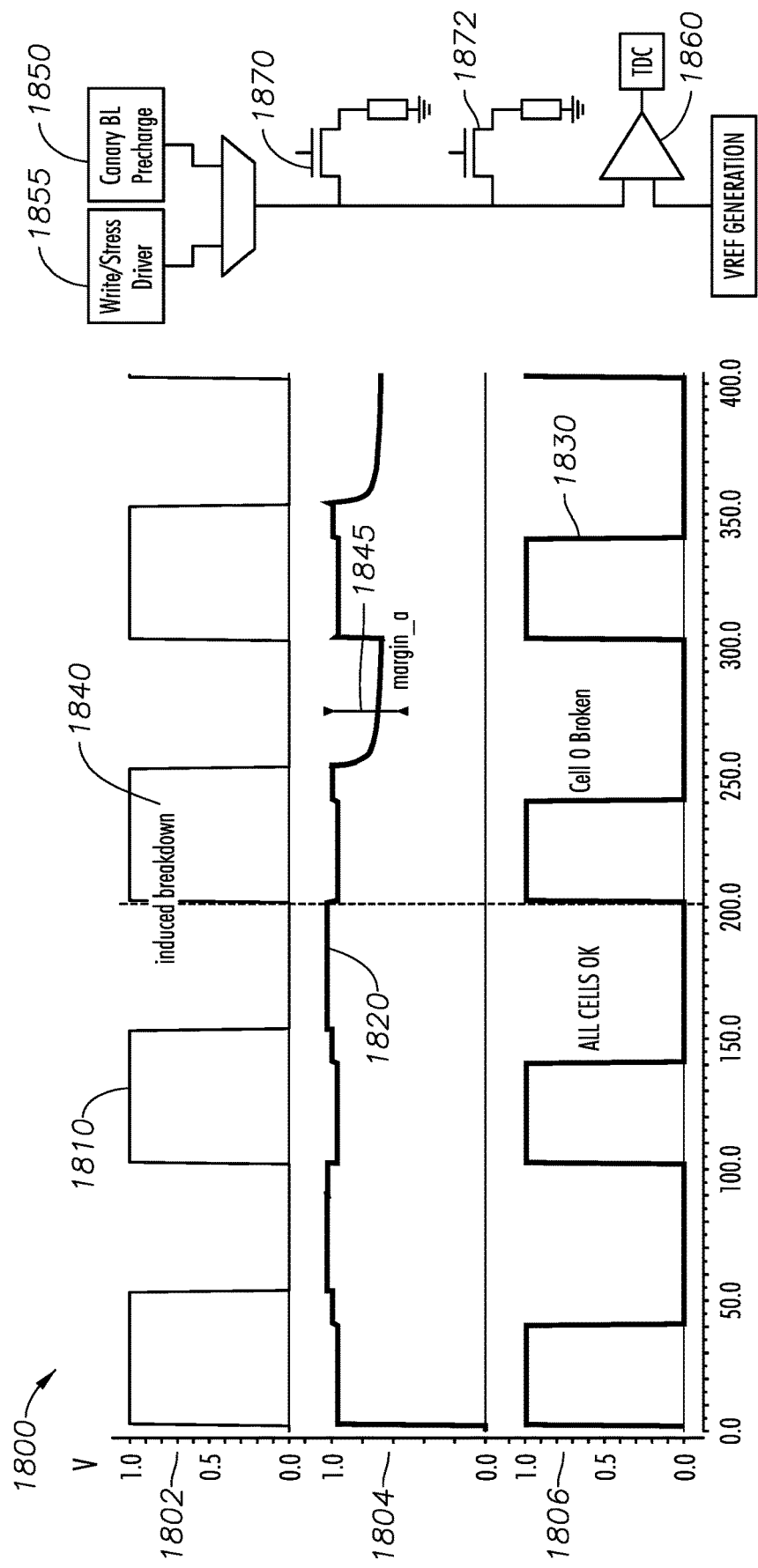

FIG. 18A is a operational graph including waveforms in accordance with various implementations described herein.

FIG. 18B is a schematic diagram of a portion of an example circuit corresponding to portions of FIG. 18A.

FIG. 19A is a operational graph including waveforms in accordance with various implementations described herein.

FIG. 19B is a schematic diagram of a portion of an example circuit corresponding to portions of FIG. 19A.

Figures 20A, 20B:
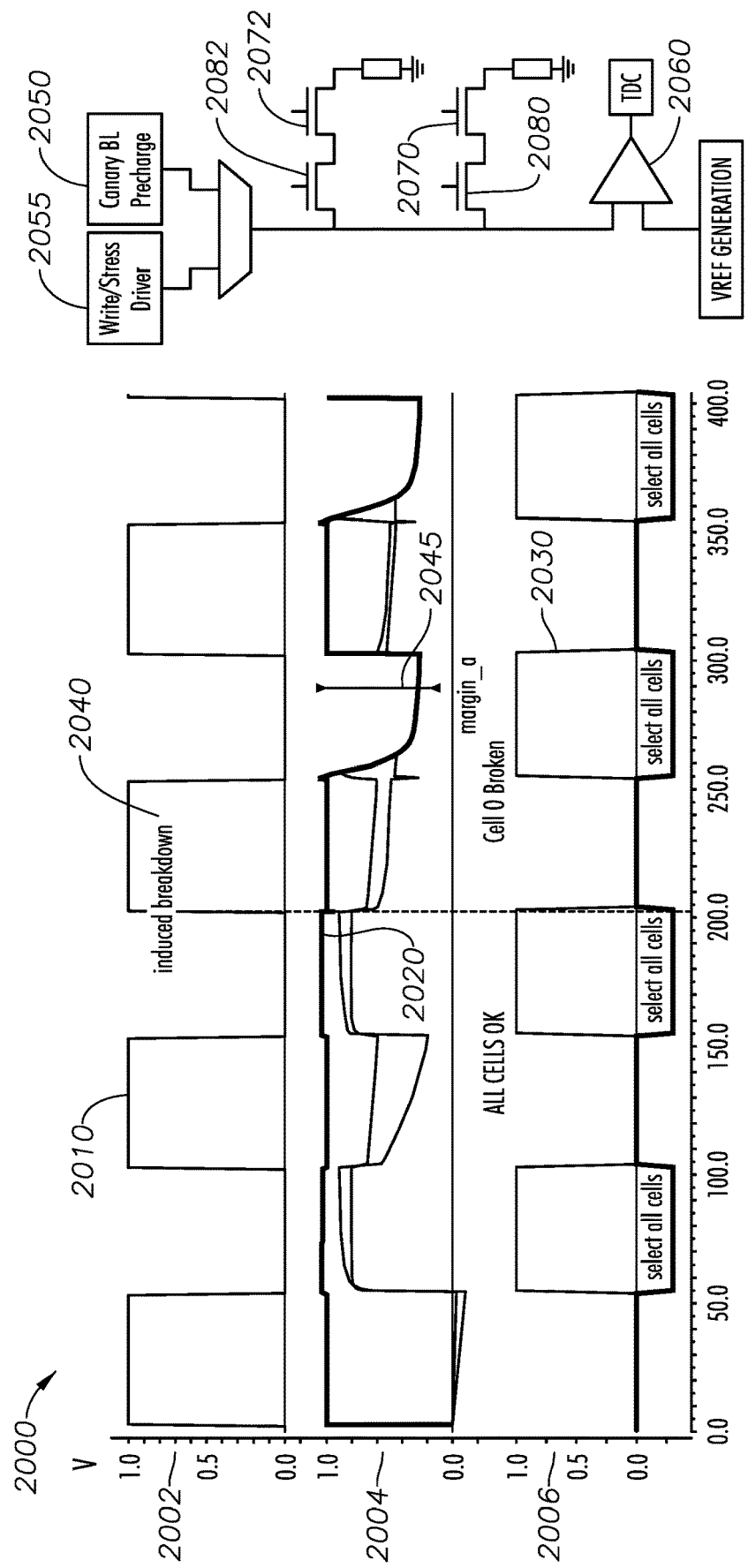

FIG. 20A is a operational graph including waveforms in accordance with various implementations described herein.

FIG. 20B is a schematic diagram of a portion of an example circuit corresponding to portions of FIG. 20A.

Figures 21A, 21B:
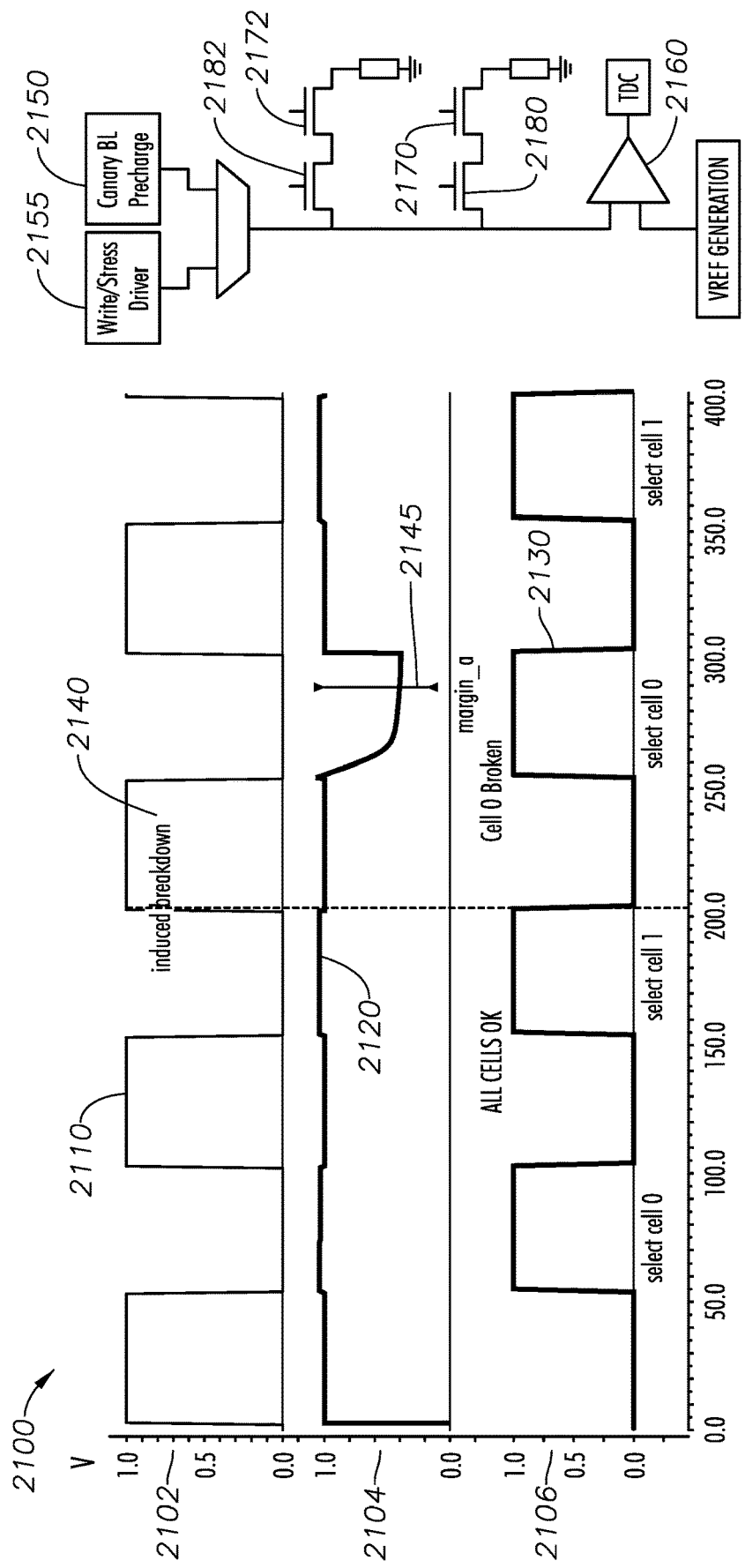

FIG. 21A is a operational graph including waveforms in accordance with various implementations described herein.

FIG. 21B is a schematic diagram of a portion of an example circuit corresponding to portions of FIG. 21A.

Figure 22:
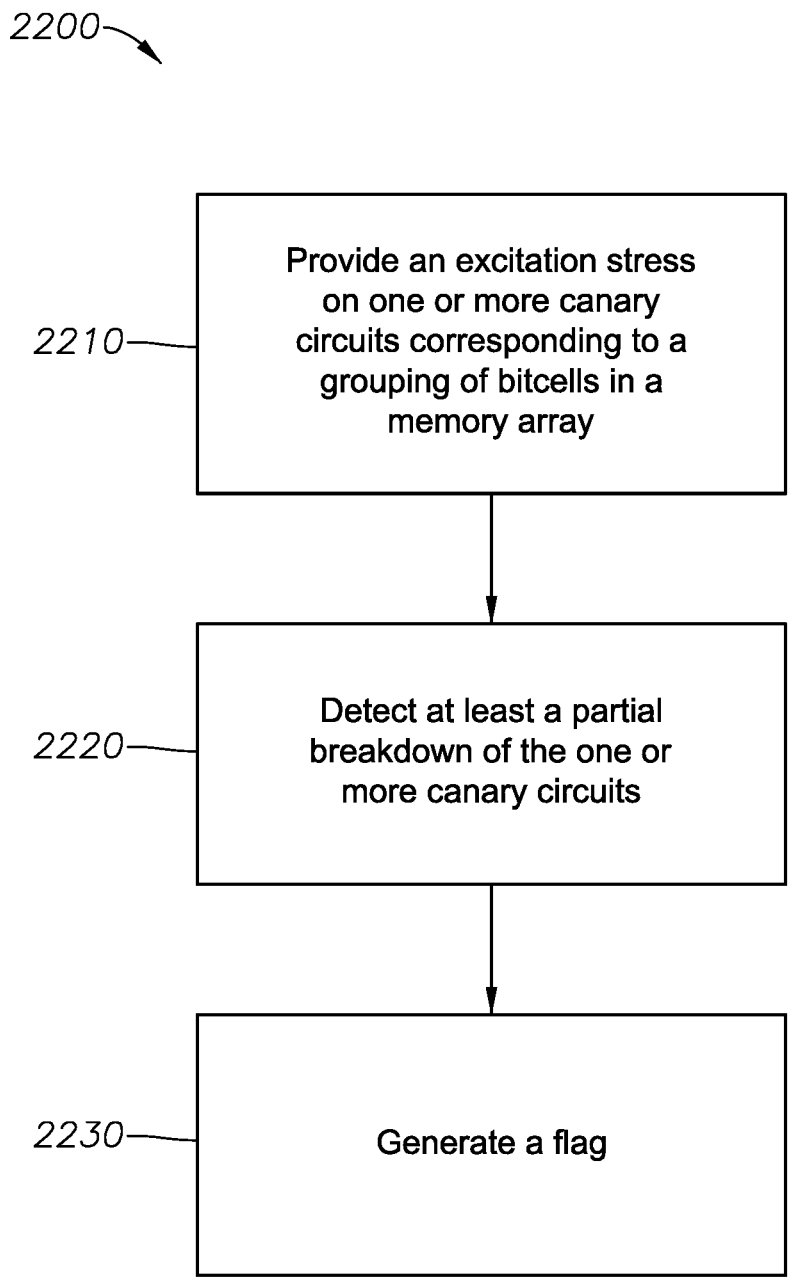

FIG. 22 is an operation method in accordance with various implementations described herein.

Figure 23:
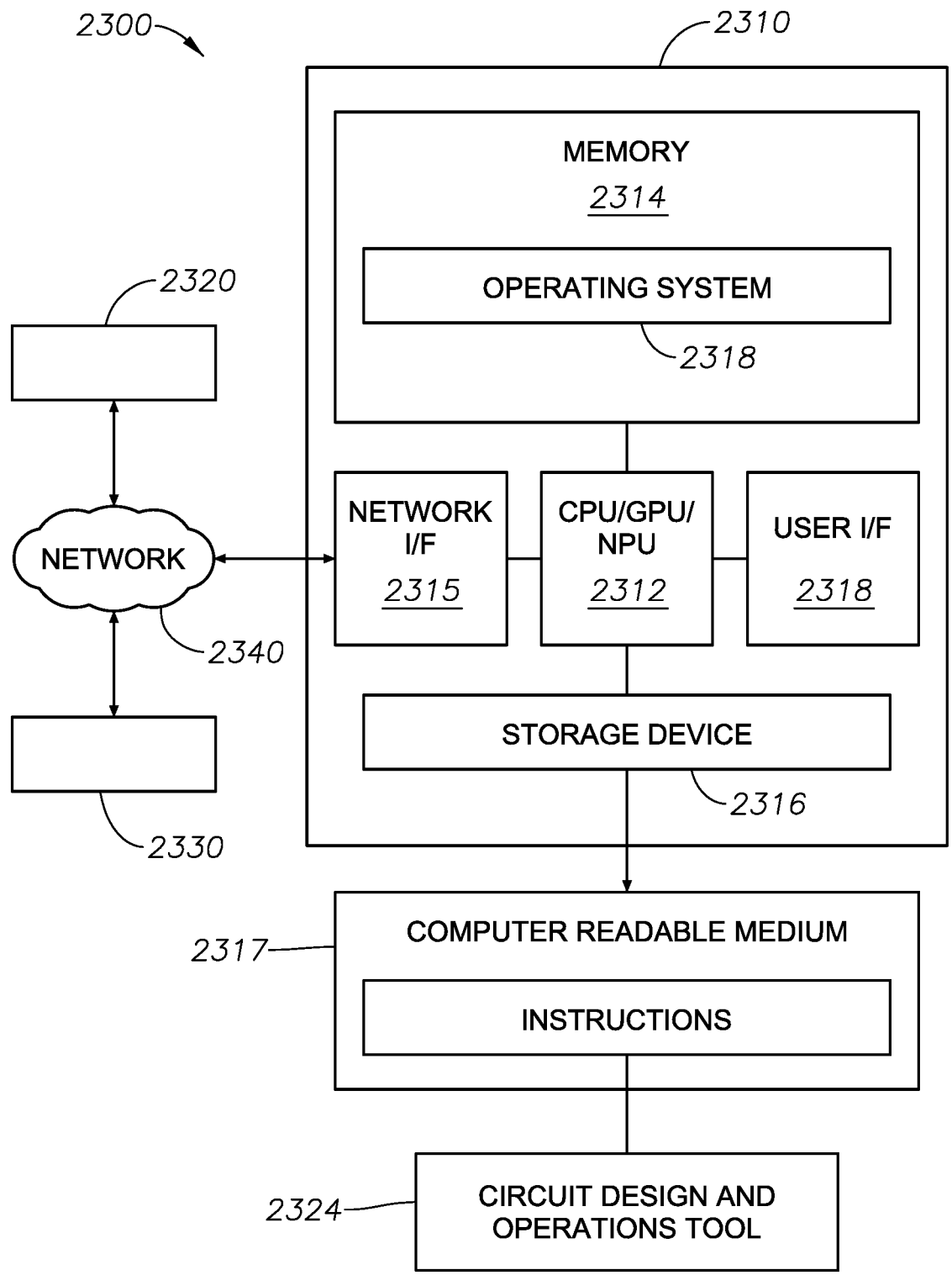

FIG. 23 is a block diagram in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, a circuit comprises: a memory array comprising one or more groupings of bitcells, one or more bitlines, and one or more wordlines; and one or more canary circuits coupled to the memory array, wherein each of the canary circuits is configured to predict at least partial breakdown of a corresponding grouping of bitcells in the memory array.

According to one implementation of the present disclosure, a method includes: providing an excitation stress on one or more canary circuits corresponding to a grouping of bitcells in a memory array; detecting at least a partial breakdown of the one or more canary circuits; and generating a flag.

According to one implementation of the present disclosure, a circuit comprises: a memory array comprising one or more groupings of bitcells, one or more bitlines, and one or more wordlines; one or more canary circuits coupled to the memory array; and a canary control circuit configured to induce at least partial breakdown of the one or more canary circuits to predict degradation of the memory array.

Figure 1:
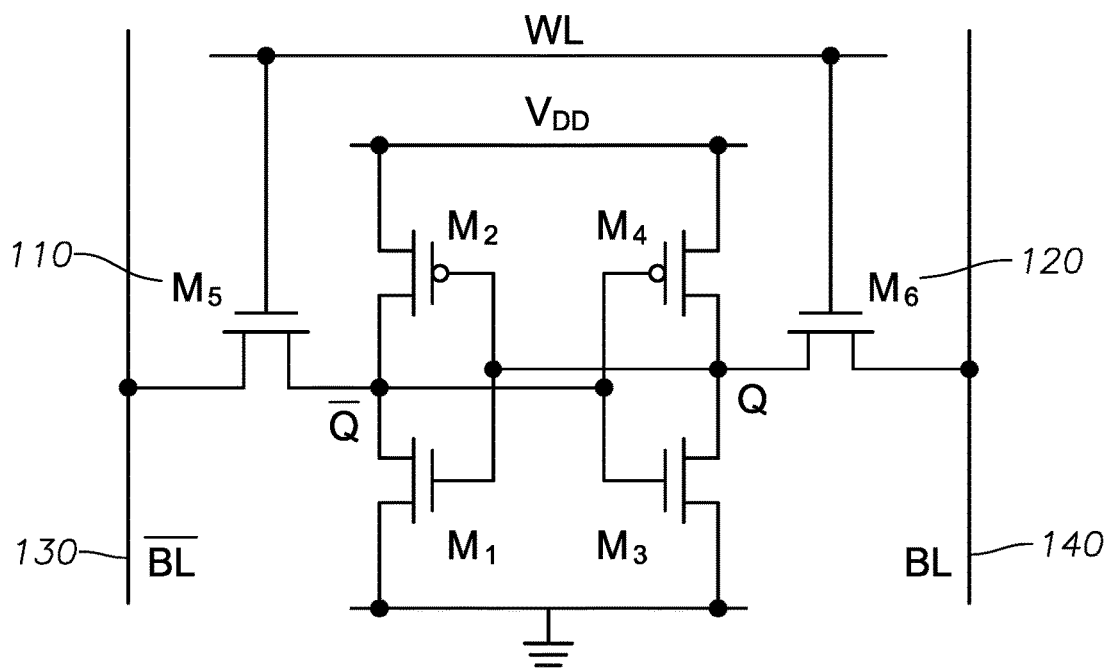
FIG. 1 is a schematic diagram of a portion of an example circuit in accordance with various implementations described herein.

Referring to FIG. 1, an example static random-access memory (SRAM) cell 100 is shown. In an example operation, access device transistors (i.e., access devices) (M5) 110 and (M6) 120, of the SRAM cell 100 provide access to the bitlines ($\overline{BL}$, BL) 130, 140, respectively. In other memory device technologies (e.g., dynamic random-access memory (DRAM) and non-volatile memories (NVM) (not shown)), access devices similarly provide access to the bitlines. Over time, such devices (e.g., M5 and M6) can be subject to gate breakdown; a phenomenon in transistors where a permanent conductive path is generated between the gate of an access device and a coupled terminal. Such a gate breakdown can materialize as a high level of current that impedes the access device from functioning as a switch, as well as generating considerable leakage currents. As defined herein, an at least partial breakdown (e.g., as used for the range between a minor breakdown and a failure state) includes an irreversible short-circuit in the insulating gate oxide of the transistors.

Figure 2:
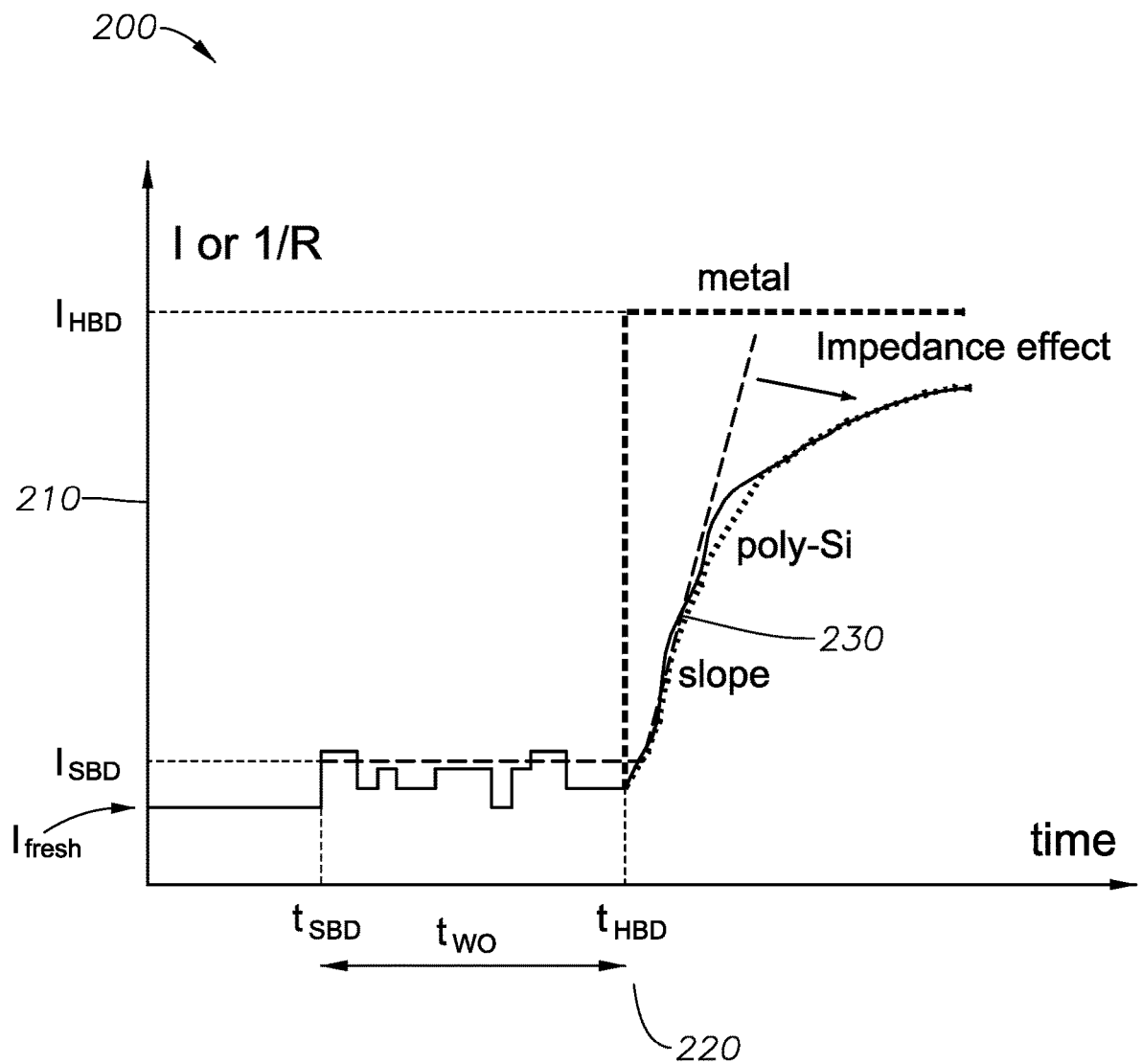
FIG. 2 is a graph in accordance with various implementations described herein.
Figure 3:
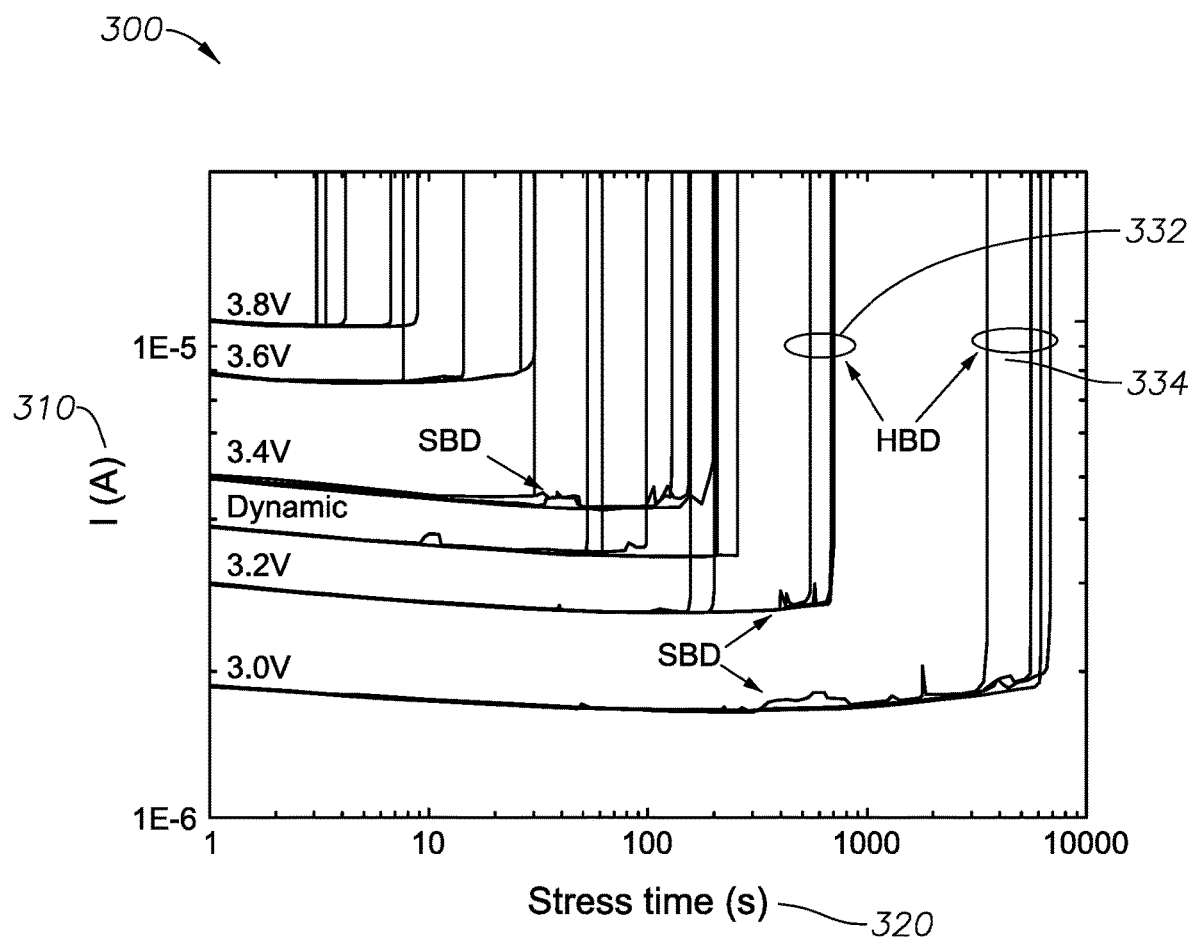
FIG. 3 is a graph in accordance with various implementations described herein.
Figure 4:
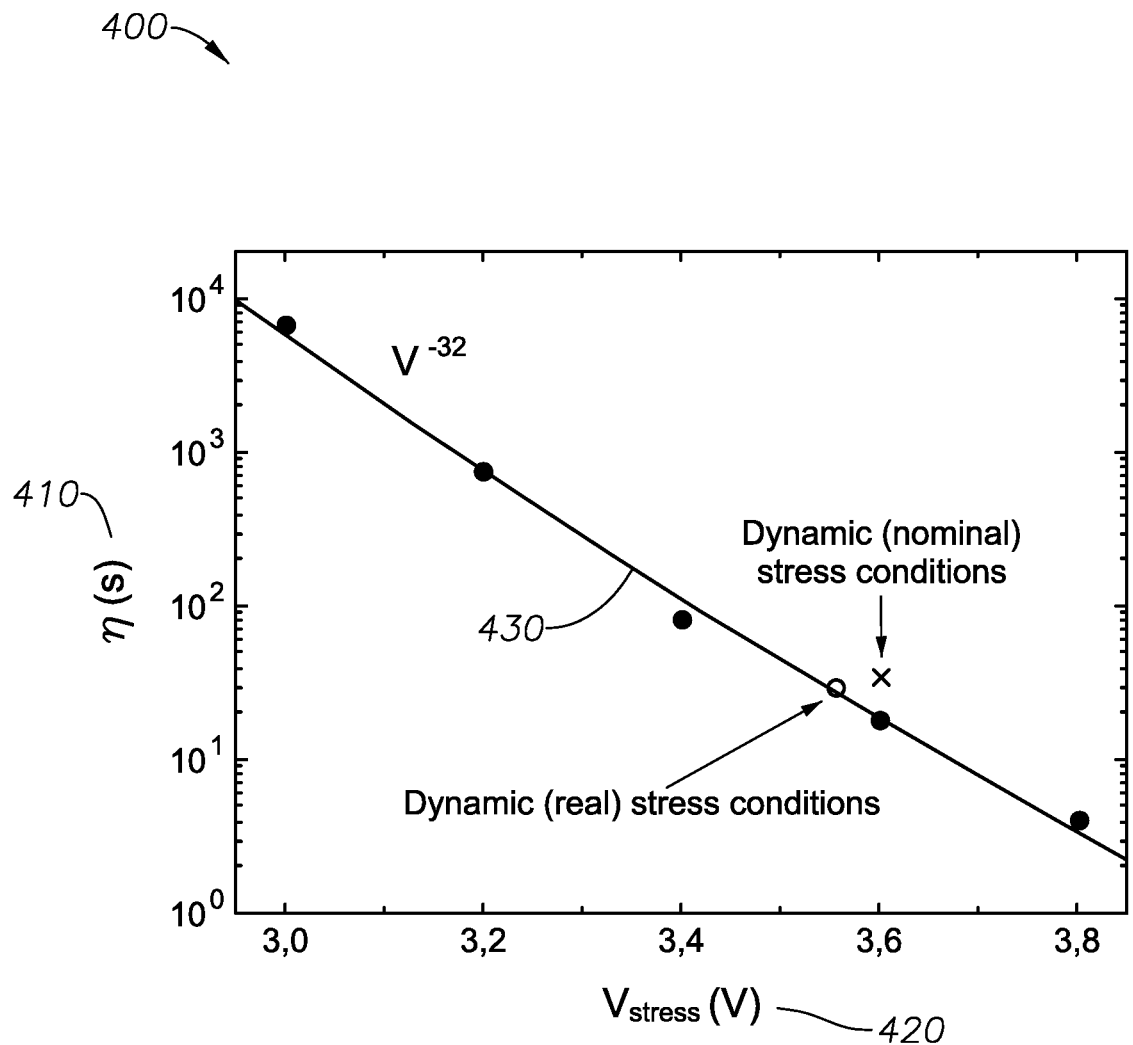
FIG. 4 is a graph in accordance with various implementations described herein.

Referring to FIGS. 2-4, graphs 200, 300 and 400 are shown. As may be appreciated, gate breakdown can be a function of: the electrical field that is stressing the access device, temperature, as well as other factors. As illustrated, graphs 200, 300, and 400 depict how increasing levels of voltage or current stress and/or providing stress periods for longer durations, breakdown events occur or can be induced earlier in time. For instance, graph 200 illustrates a gate current response after a gate breakdown. In FIG. 2, graph 200 illustrates current (I) on the Y-axis 210 and time (t) on the X-axis 220. At the time point $T_{HBD}$ (e.g., a particular time of break down) onward, a significant rise in gate current (I) is observed by the rise of the curve 230 as the time duration of the stress increases. In FIG. 3, graph 300 illustrates current (A) (on the Y-axis 310) as a function of stress time (s) (on the X-axis 320), while in FIG. 4, the graph 400 illustrates time to a greater probability of breakdown (TO) (e.g., 63%) as a function of a provided stress voltage (Vstress) (V). As may be observed, breakdown points (e.g., HBD 332, 334, and curve 430) are dependent upon the duration (e.g., stress time (s) 320) as well as a stress voltage (e.g., Vstress (V) 420) performed on an access device. In one comparison, as shown with respect to FIG. 3, the greater the applied voltage stress (e.g., operating at voltage 3.8V as opposed to 3.0V), the sooner in time the access transistor can be induced to fail. Hence, the larger an applied voltage and/or duration, the earlier in time a breakdown event can occur.

As may be appreciated, different memory device technologies operate at different voltages, and would provide different responses to breakdown. Nevertheless, it is often the case that higher voltages at the gate of an access device would lead to faster operation points (e.g., for non-volatile memories (NVMs), SRAMs), and that NVMs may sometimes require a "thicker" gate oxide layer in the devices to be able to handle the high voltages or currents in writing operations for a memory cell. For instance, SRAMs in advanced technologies (e.g., 16 nm and below) may rely on write-assist to work at logic compatible voltage. In such instances, the write assist may either "pump" a word-line voltage above the supply or "pump" the bit-line voltage below ground. In both scenarios, the result is an electrical overstress across the gate of an access device. In another example, NVM (e.g., STT-MRAM) would require high write current (e.g., approximately 100 mA) for a longer duration (e.g., approximately 200 ns). Such a process would require higher word-line voltage that would also cause an electrical overstress across a gate of an access device.

As may be appreciated, access device endurance can be characterized as a function of the stress "suffered" by a cell. With respect to FIGS. 1-4, the amplitude of the duration of the stress pulses exciting a cell determines the lifetime of the access devices. In certain instances, the faulty ratio dependence on voltage or current amplitude on voltage/current amplitude and duration is dependent on the specific technology and is predetermined by a designer.

Figure 5:
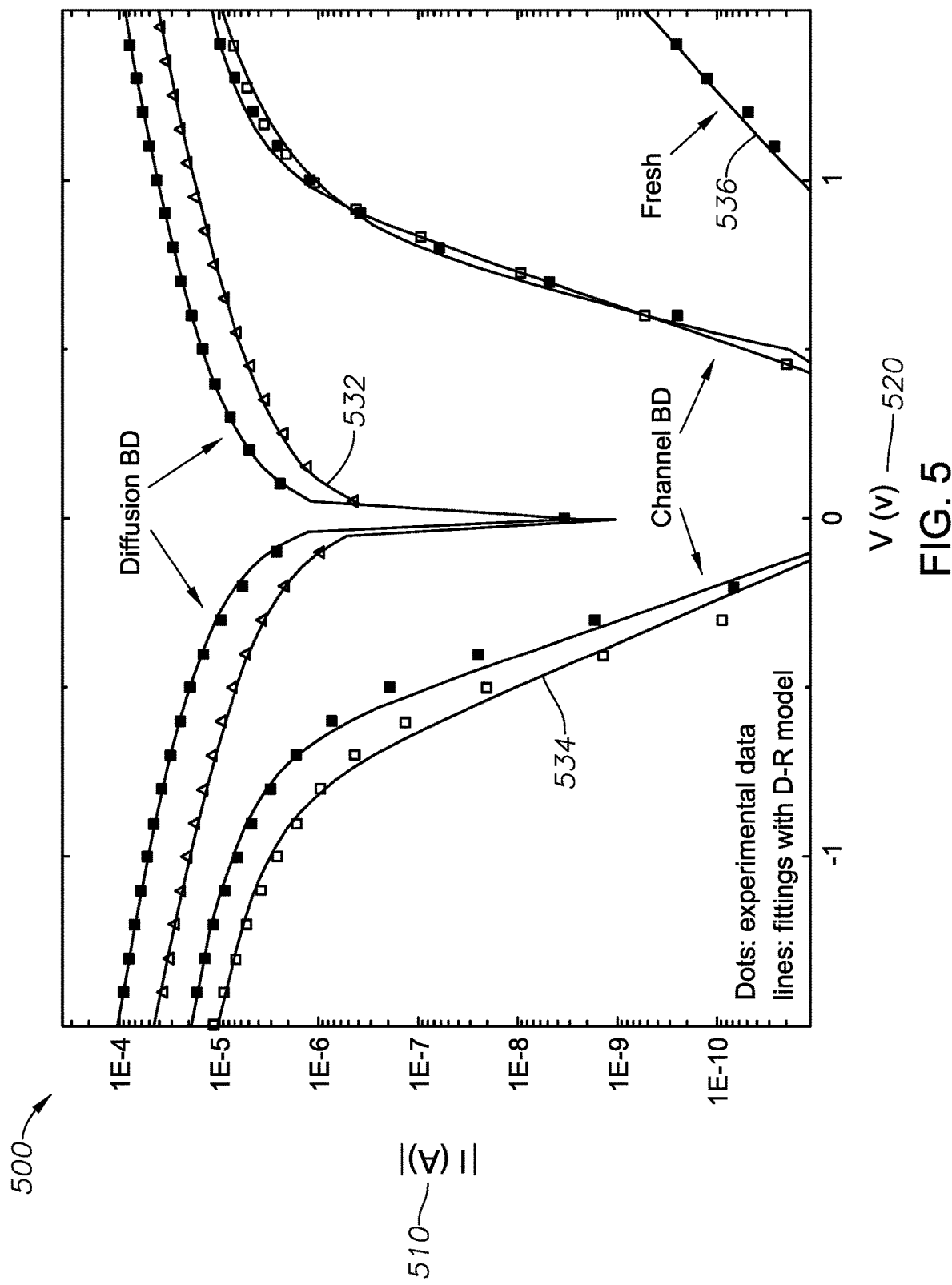
FIG. 5 is a graph in accordance with various implementations described herein.

Referring to FIG. 5, an example graph 500 according to example implementations is shown. Graph 500 illustrates data points corresponding to experimental data lines fitting with a D-R model. As illustrated, the absolute value of current (in amps) is shown on the Y-axis 510, while voltage (V) (in volts) is shown the X-axis 520. The data point curves 532, 534 depict that upon an excitation of 1V, after a breakdown event, the conductive path (e.g., diffusion breakdown (BD) and channel breakdown (BD)) would provide approximately a 10K (1V~0.1 ma) conductive path. In comparison, the conductive path can be observed to be 1e10 ohm when there is no breakdown (i.e., fresh sample). Hence, as can be inferred, the seven order of magnitude in combination with the tradition loads in a 1T1R (1 transistor, 1 resistor) (5K to 25K) design would make detection possible. Moreover, it is noted that a load of inverters that store a "1"

in a SRAM cell would be in the range of an magneto-resistive random-access memory (MRAM) load. Hence, in this approach, tuning would still be required for the specific memory technology.

Advantageously, inventive aspects of the present invention provide schemes and techniques to monitor memory cell access devices in a memory array (e.g., a main memory) via the detection of at least partial degradation of canary access devices. Such canary access devices may be coupled to and correspond to the memory cells so as to anticipate degradation or failure of access devices of the memory cells. In inventive schemes and techniques, as described herein, the inventive capabilities allow for accurate determination for "when" failure of the memory cells access devices in the memory array (e.g., a main memory) will occur and to take appropriate response action. Advantageously, in certain aspects as described herein, such capabilities can be made possible by providing different voltages to each column of canary circuits, where each different voltage would correspond to different time intervals of the same specified memory cell access devices in the memory array.

In certain implementations, a particular canary access device may be "over-stressed," either in electrical amplitude or by pulse widths. In certain implementations, advantageously, canary access devices may be designed such that the devices would be subject to substantially the same activity pattern (e.g., of voltage or current stress) as the corresponding memory cells that are being monitored. In doing so, accuracy in detection may be ensured and false alarms may be avoided.

As may be appreciated, the amount of "over-stress" may be determined based on the specific memory cell technology, the margining of "secure-ness" (i.e., the margin of prediction error that can be tolerated), as well as the early detection time requirements (i.e., how early it is desired to predict possible failure in the monitored memory). For example, the earlier the desire is to raise an alarm, the higher an over-stress may be set such that the canary cell under stress would fail sooner.

Referring to FIGS. 6A-D, an example single column of canary circuits 600 and one example operation is shown according to example implementations. As illustrated, in FIG. 6A, the single column of canary circuits 600 comprises one or more canary circuits 610 (e.g., canary circuits 610a, 610b etc.) and a comparator 620 coupled via a bitline 630, and wordlines 632 (e.g., 632a, 632b, etc.). Also, each of the one or more canary circuits comprises a selector device 611 (e.g., 611a, 611b, etc.) (e.g., transistor; access device) and a load 612 (e.g., 612a, 612b etc.) (e.g., a resistor, a "dummy" element, or an active MOSFET). In certain implementations, the load 612a, 612b may be approximately matched (e.g., approximately 90% or more of actual resistive load or active MOSFET) to a corresponding load of the grouping of bitcells. FIG. 6B illustrates a first example signal response 662 on the bitline 630 when there is a "broken" canary circuit in the column, as well as a second example signal response 664 on the bitline 630 when no canary circuits are broken and are, thus, fully functional. FIG. 6C illustrates a representation of a reference voltage signal 672. FIG. 6D illustrates representations of an digital output 682 of the comparator 620 when there is a "broken" canary circuit, as well as representations of an digital output 684 of the comparator 620, 630 when no canary circuits are broken.

According to the example operation, utilizing a read control signal, a designer may detect whether a particular canary cell is not operating at optimal functionality. For instance, the operation may utilize a control signal (as described in greater detail in later paragraphs) to precharge the canary bitline 630, while the circuit 600 may be configured to compare a response of a particular canary circuit (e.g., 610b, as shown) against a known and fully-operational canary circuit signal response. In one example, wordlines of each of the canary circuits not-under-test (e.g., wordline 632a, as shown) may be set to low (e.g., a digital "0"), while the wordline of the canary circuit-under-test (e.g., wordline 632b, as shown) may be set to an operating voltage below a provided threshold (e.g., VWL). In such a scenario, if the device-under-test, for example, canary circuit 632b is "broken" (e.g., a partial breakdown) as shown, for example, by the signal response 662, the voltage on the bitline 630 would discharge rapidly. Correspondingly, a known pattern would also emerge at the comparator output (e.g., as shown by digital output 682).

Figure 7:
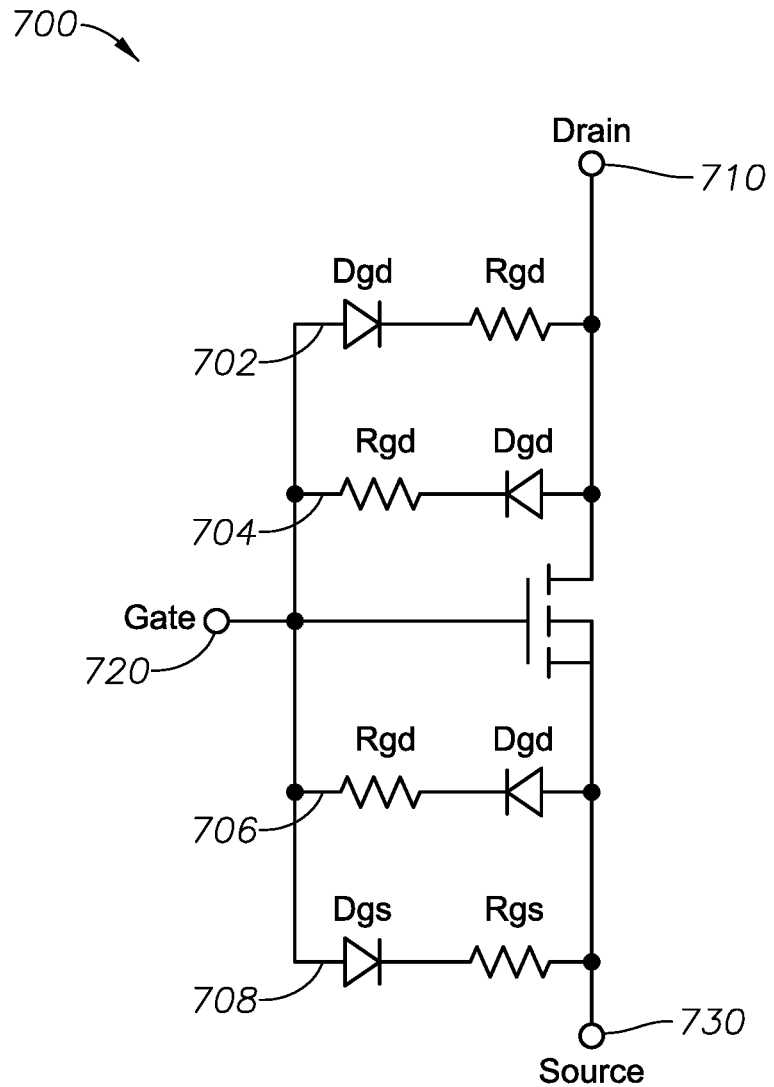
FIG. 7 is a schematic diagram of a portion of an example circuit in accordance with various implementations described herein

Referring to FIG. 7, an example model of a "broken" canary access device 700 is shown. In certain implementations, the canary access device 700 (i.e., access device) (e.g., transistor device) may correspond to the selector device 611 (as illustrated in FIG. 6). As shown, the canary access device includes a drain terminal 710, a source terminal 720, and a gate terminal 730. Also depicted are conductive paths (i.e., discharge paths) (e.g., gate-drain 702, drain-gate 704, source-gate 706, and gate-source paths 708) that are generated when such an access 700 is broken. As an example, each of the conductive paths 702, 704, 706, 708 include respective diodes D and resistors R.

In a normal operation of the access device, when a voltage is provided to a drain terminal 710, and the access device is not broken, no current leakage would extend between source and gate terminals 730, 720, and drain and gate terminals 710, 720. In some instances, even if there is minor current leakage between source and drain terminals 730, 710, because the respective diodes D have a significantly lower threshold voltage than the voltage required to turn the access device "on" (e.g., Vth≤VWL), no leakage would extend to the gate terminals 720.

In the example normal operation of a functional and unbroken canary device, as described with reference to FIGS. 6A-D and 7, there would be no extraneous conductive paths (e.g., conductive paths 702, 704, 706, 708) that connect gate and drain terminals 720, 710 or gate and source terminals. In such cases, the respective diodes would impede current flow, and therefore, restrict the discharge from the conductive paths 702, 704, 706, 708. Hence, there would be a disconnection between the gate terminal and the source and drain terminals, as an open circuit, and no leakage would occur through the selector device 611 and load 612. This result occurs since the selector device 611 is operating below a provided threshold voltage (where the threshold varies depending on the specific memory technology). Accordingly, the respective diodes would prevent the current from flowing and the device nodes from discharging.

In the operation as described with reference to FIGS. 6A-D, when the wordline voltage is zero (e.g., 632a), and if the access device 700 (e.g., selector 611a) has a broken gate, because zero voltage is not sufficient for leakage from the drain terminal 710 to the source terminal 730, no leakage would occur. However, in instances when the wordline voltage is, for example, VWL (e.g., 632b), and if the access device 700 (e.g., selector 611b) has a broken gate, there would be a current leakage from the drain terminal 710 to the gate terminal 720. This extraneous current that flows (i.e., a differential current) is represented by the signal response 662 on the bitline 630, as well the output 682 of the comparator 620. Similar operations may be performed with reference to the column of canary circuits 800 and 900 in FIGS. 8 and 9.

Advantageously, inventive aspects detect the differential current to determine whether the access device is in fact broken. Moreover, in certain schemes and techniques (as described in later paragraphs), a sensing voltage may be provided on a per-row basis to ascertain which corresponding row in a memory array has a problem.

Referring to FIGS. 8A-D, a single column of canary circuits 800 and one example operation is shown according to example implementations. As illustrated, in FIG. 8A, the single column of canary circuits 800 includes one or more canary circuits 810 (e.g., canary circuits 810a, 810b etc.), a comparator 820 coupled via a bitline 830, and wordlines 832 (e.g., 832a, 832b, etc.). Also, each of the one or more canary circuits 810 comprises a first selector device 812 (e.g., 812a, 812b, etc.) (e.g., transistor; access device), a second selector device 814 (e.g., 814a, 814b, etc.) (e.g., transistor; access device), and a load 812 (e.g., 812a, 812b etc.) (e.g., a resistor, a "dummy" element, or an active MOSFET). In certain implementations, the load 812a, 812b may be approximately matched (e.g., approximately 90% or more of actual resistive load or active MOSFET) to a corresponding load of the grouping of bitcells.

As shown, each of the second selector devices 814 may be coupled in series to a respective first selector device 812. The second selector device 814 can be configured to control activation of a particular canary circuit 810 in the column. Advantageously, the second selector device 814 may be configured to provide sequential "read" capability of the canary circuits 810 independent of the quantity activated wordlines and connections to the wordlines of a memory array. Correspondingly, the second selector device 814 may be configured to enable decoupling of an access of a respective canary circuit 810 from access of an associated wordline 632 (i.e., decoupling from a respective wordline of the one or more wordlines). In certain examples, second selector devices 814 may be designed to have a low voltage threshold (low-Vt) or is p-type, and wide enough to "drive" the bitline voltage with minimum voltage drop.

Figure 8A:
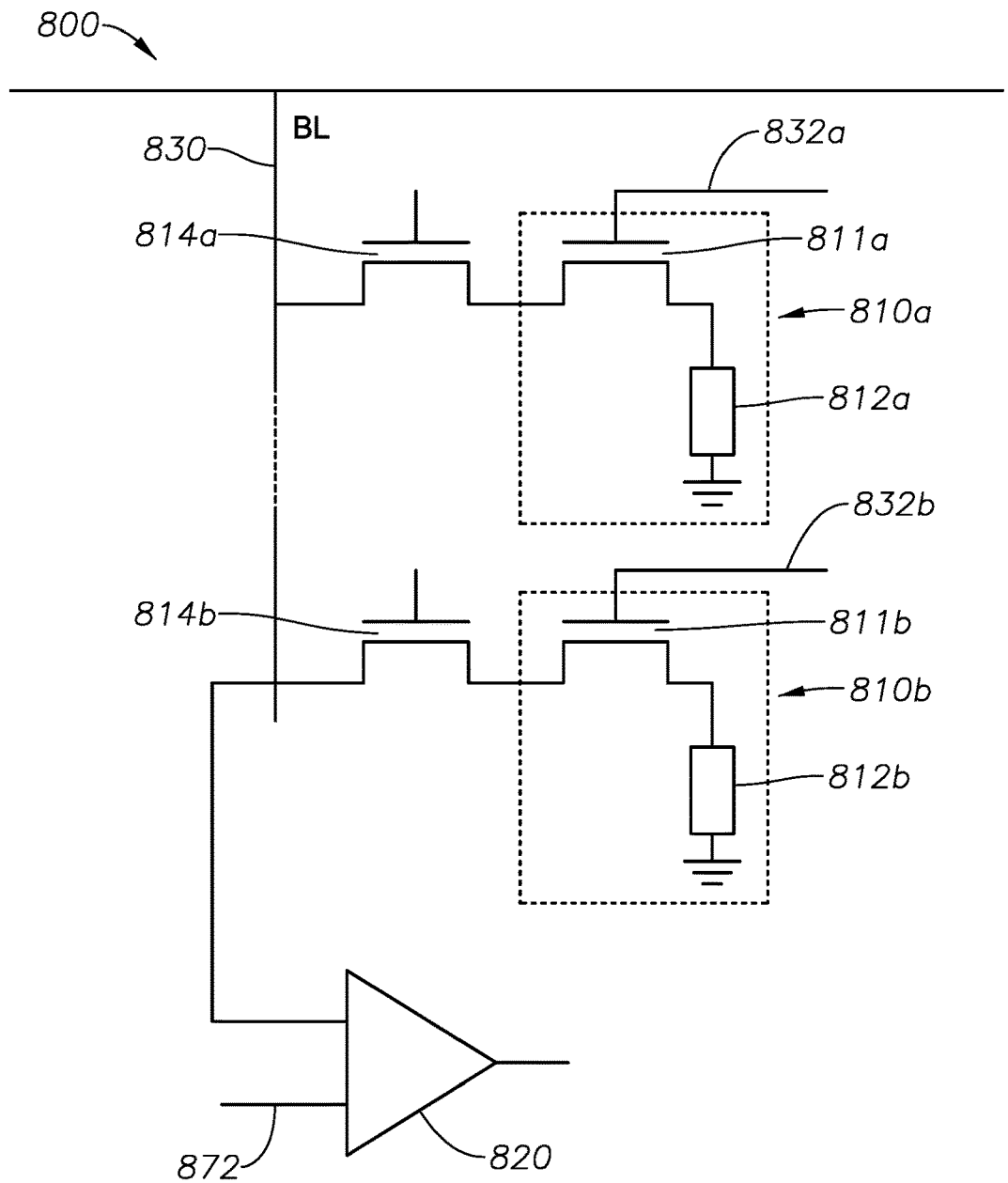
FIG. 8A is a schematic diagram of a portion of an example circuit in accordance with various implementations described herein.
Figure 8B:
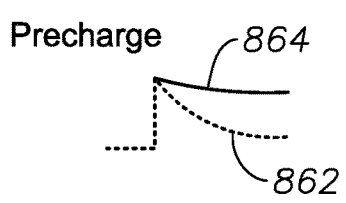
FIGS. 8B-8D are operational graphs including waveforms corresponding to portions of FIG. 8A.
Figure 8C:
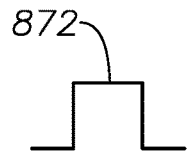
Figure 8D:
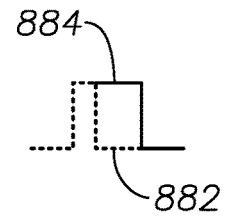

Similar to FIG. 6B, FIG. 8B illustrates a first example signal response 862 on the bitline 830 when there is a "broken" canary circuit, as well as a second example signal response 864 on the bitline 830 when no canary circuits of the column are broken and are, thus, fully functional. Also similar to FIG. 6C, FIG. 8C illustrates a representation of a reference voltage signal 872 to the comparator 820. Like FIG. 6D, FIG. 8D illustrates representations of an digital output 882 of the comparator 820 when there is a "broken" canary circuit, as well as representations of an digital output 884 of the comparator 820, 830 when no canary circuits are broken. Similar to the example operation with reference to FIGS. 6A-D, a similar operation may be performed with reference to FIGS. 8A-D.

Referring to FIGS. 9A-D, a single column of canary circuits 900 and one example operation is shown according to example implementations. As illustrated, in FIG. 9A, the single column of canary circuits 900 comprises one or more canary circuits 910 (e.g., canary circuits 910a, 910b etc.), a comparator 920 coupled via a bitline 930, a time-to-digital converter (TDC) or counter 940 coupled to the comparator 920, and wordlines 932 (e.g., 932a, 932b, etc.). In certain cases, the wordlines 932 may be coupled to corresponding groupings of bitcells in an adjacent memory array (e.g., as shown in FIGS. 11-21). Also, each of the one or more canary circuits 910 comprises a first selector device 911a (e.g., 911a, 911b, etc.) (e.g., transistor; access device), and a load 912 (e.g., 912a, 912b etc.) (e.g., a resistor, a "dummy" element, or an active MOSFET). In certain implementations, the load 912 (e.g., 912a, 912b) may be approximately matched (e.g., approximately 90% or more of actual resistive load or active MOSFET) to a corresponding load of the grouping of bitcells (as shown, e.g., in FIGS. 11-21).

Figure 9A:
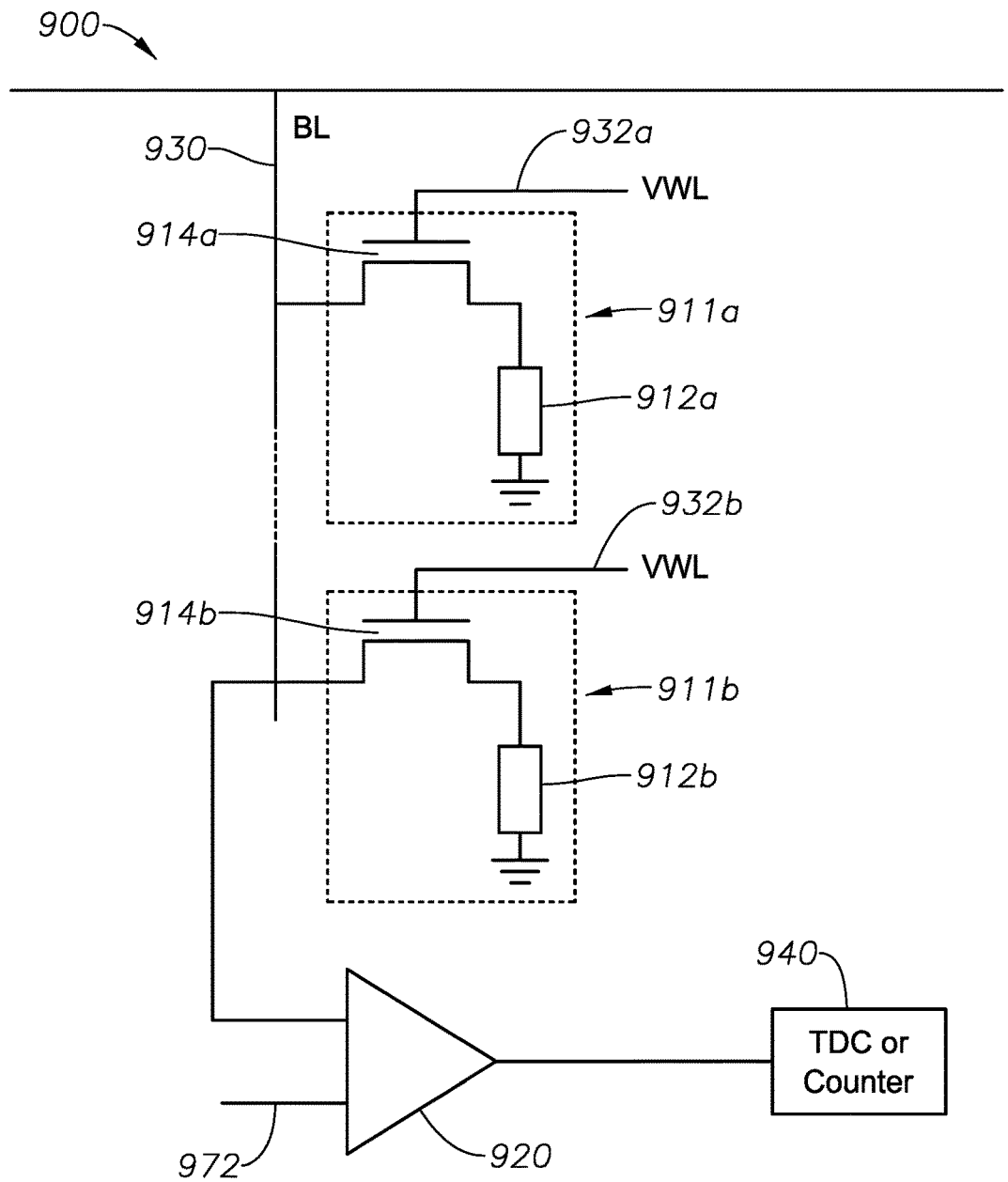
FIG. 9A is a schematic diagram of a portion of an example circuit in accordance with various implementations described herein.
Figure 9B:
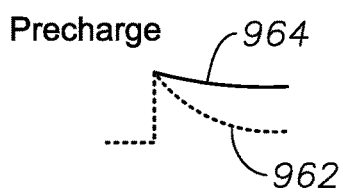
FIGS. 9B-9D are operational graphs including waveforms corresponding to portions of FIG. 9A.
Figure 9C:
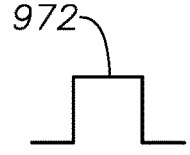
Figure 9D:
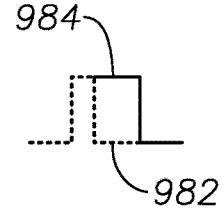

Similar to FIGS. 6B and 8B, FIG. 9B illustrates a first example signal response 962 on the bitline 930 when there is a "broken" canary circuit, as well as a second example signal response 964 on the bitline 930 when no canary circuits of the column are broken and are, thus, fully functional. Also similar to FIGS. 6C and 8C, FIG. 9C illustrates a representation of a reference voltage signal 972 to the comparator 920. Like FIGS. 6D and 8D, FIG. 9D illustrates representations of an digital output 982 of the comparator 920 when there is a "broken" canary circuit, as well as representations of an digital output 984 of the comparator 920, 930 when no canary circuits are broken. Similar to the example operation with reference to FIGS. 6A-D and 8A-D, a similar operation may be performed with reference to FIGS. 9A-D.

In an example operation (e.g., a column read operation), each of the of the wordlines 932 is activated with a predetermined wordline voltage (e.g., VWL, a substantially similar wordline voltage). For example, this wordline voltage (VWL) may be less than that of a nominal voltage and at a level low enough for the bitline 930 to discharge at a rate slow enough to effectively monitor for breakdown (of a canary circuit) with the TDC or counter 940. Accordingly, this wordline voltage may be a relatively "small" negative voltage (e.g., approximately −0.3V) whose absolute value may be less than a nominal voltage threshold. The nominal threshold voltage would correspond to a rate of voltage discharge of a bitline to allow a time-to-digital converter (TDC) or counter to detect a breakdown of at least one of the one or more canary circuits. For instance, if no canary circuit 910 is broken, the TDC or counter 940 would be in a known expected range (e.g., as based on the particular memory technology). Otherwise, if one canary circuit 910 of the column is broken, the TDC or counter 940 would be less than the expected range. Hence, advantageously, an operator would be able to detect a breakdown event of canary circuits from a single column read operation. Nevertheless, in this particular operation by itself, information regarding whether at least one canary circuit may be broken would become known, however, specific information regarding the specific canary circuits that are broken would require additional testing (as described in other implementations as described herein).

Referring to FIG. 10, an example SRAM canary circuit 1000 is shown (of an example SRAM bitcell memory array) according to example implementations. As illustrated, the canary circuit 1000 includes first and second selector devices 1010, 1020 (i.e., access devices) (e.g., transistors) coupled to first and second bitlines 930, 931 (BL, NBL) and wordline 932, and first and second inverters 1030, 1040. In certain implementations, the first selector device 1010 may be engineered for earlier breakdown. For instance, in one example, this may be accomplished by the first selector device 1010 being designed (i.e., engineered) with a "thin" gate oxide layer (e.g., a thickness between 1 nm and 10 nm). In a second example, in an example operation, the voltage from the gate terminal to the source terminal (VGs) of the first selector device 1010 may be increased by utilizing a negative bitline boost voltage (−ΔV) during write operations. Moreover, in certain operations to detect a possible breakdown of the first access device 1010 (e.g., leading to the breakdown in the canary circuit 1000), an operating voltage ($V_{DD}$) may be applied to both the wordline 932 and the second bitline 931 (NBL).

In some implementations, advantageously, a load (e.g., an active load of the SRAM, a next adjacent electrical device where the current would flow) of the canary circuit 1000 may be the second inverter 1040 (e.g., an NMOS device). Hence, in such cases, a resistor would not be required.

Referring to FIGS. 11 and 12, example canary circuitry and memory architecture 1100 and 1200 are shown according to example implementations. In FIG. 11, as illustrated, the canary circuitry and memory architecture 1100 include an example memory array 1110 (e.g., a global memory block, main memory) that is coupled but is distinct from a canary periphery 1120. In various implementations, the memory array 1100 may include a memory array portion 1112 (e.g., including memory sub-blocks 1112a, 112b, etc.) and memory array periphery 1114 (e.g., 1114a-d) (e.g., wordline driver circuitry, input/output block, wordline decoder blocks, etc.) while the canary periphery may include one or more canary circuits 1122 (e.g., 1122a-c) (i.e., canary cells) coupled to a canary control circuit 1124. Advantageously, as depicted, inventive aspects allow for the capacity for an individual canary circuit 1122 (e.g., 1122a-c) to: correspond to, monitor and predict at least partial breakdown (e.g., breakdown) of a particular sub-block (e.g., 1112a, 1112b) of the memory array 1110, one or more rows (e.g., 1112c), portions of rows (e.g., that may correspond to columns of the memory array 1110) or even a particular memory cell of the memory array 1110. In certain implementations (as described in later paragraphs), the canary control circuit 1124 may be configured to perform the operations related to monitoring and predicting the at least partial breakdown.

In FIG. 12, as illustrated, the canary circuitry and memory architecture 1200 include one or more canary circuits 1222 (e.g., 1222a-c) of a canary periphery 1220 that is incorporated within (e.g., embedded within) the memory array 1210 (e.g., a global memory block, main memory). As illustrated, in certain implementations, the memory array 1210 may include a memory array portion 1212 and memory array periphery 1214 (e.g., 1214a-d) (e.g., wordline driver circuitry, input/output block, wordline decoder blocks, etc.), and can share the memory array periphery 1214 (e.g., 1214a-d) with the canary periphery 1220. In such implementations, the canary control circuit 1224 may be coupled to the canary periphery 1220. Similar to FIG. 11 (as described in later paragraphs), the canary control circuit 1224 may be configured to perform the operations related to monitoring and predicting the at least partial breakdown.

In each of the implementations of FIGS. 11-12, as well as the implementations in FIGS. 11-22, the corresponding memory array (e.g., 1110, 1210, 1310, 1410) may comprise SRAM, DRAM, or non-volatile memory (NVM). The NVM may include one of one of flash memory, ferroelectric random-access memory (FeRAM), magnetic random-access memory (MRAM), phase-change memory (PCM), and resistive random-access memory (RRAM).

FIG. 13 illustrates an example canary circuitry and memory architecture 1300 according to example implementations. In certain implementations, example canary circuitry and memory architecture 1300 may correspond to the example canary circuitry and memory architecture 1100 or 1200 in FIGS. 12 and 13. As illustrated, the example canary circuitry and memory architecture 1300 may include a memory array 1310, one or more canary circuits 1322 coupled to the memory array 1310, and a canary control circuit 1324 configured to induce at least partial breakdown of the one or more canary circuits to predict degradation of the memory array 1310. The memory array 1310 may comprise one or more groupings of bitcells 1312 (e.g., banks, blocks, rows, sub-blocks), memory array periphery 1314 (e.g., wordline driver circuitry, etc.), one or more bitlines 1330 (e.g., 1330a, 1330b . . . 1330n), and one or more wordlines 1332, 1334 (e.g., 1332a, b n, 1334a, 1334b, . . . 1334n etc.).

As shown, the one or more canary circuits 1322 comprise one or more columns of canary circuits 1320 (e.g., 1320a, 1320b, . . . 1320n etc.) (i.e., canary periphery). Advantageously, by having different columns 1320 (e.g., 1320a, 1320b, . . . 1320n etc.), inventive aspects allow for the capability to predict at least partial breakdown (e.g., failure) at different time intervals. Accordingly, the inventive capabilities allow for accurate determination for "when" failure will occur in the corresponding memory array 1310 (e.g., a main memory) and to take appropriate response action. As a further advantage, such capability may be achieved when the voltages at which each column may operate is different or by engineering of each canary device (e.g., providing thinner gate oxides, etc.). In addition, the canary control circuitry 1324 may be configured to the manage a stress frequency based on the activity of the main memory 1310. For instance, a particular canary may be more often stressed if the particular bank/block/row/etc. that the canary is "linked" to experiences more activity.

In certain implementations, the column of canary circuits 1320 (e.g., 1320a, 1320b, 1320n etc.) may include: a stress driver circuit 1351 (e.g., 1351a, 1351b, . . . 1351n etc.) (e.g., a write driver circuit in certain instances); a precharge circuitry 1352 (e.g., 1352a, 1352b, . . . 1352n etc.); and circuitry 1353 (e.g., 1353a, 1353b, . . . 1353n etc.) (e.g., multiplexers, NMOS or PMOS devices) configured to control a gate signal to select (i.e., control) between the stress driver circuit 1351 or the precharge circuitry 1352. Moreover, in some implementations, each of the one or more columns of canary circuits 1320 (e.g., 1320a, 1320b, . . . 1320n etc.) (i.e., canary periphery) may also include: reference voltage generation circuitry 1372 (e.g., 1372a, 1372b, 1372n etc.), a comparator 1354 (e.g., 1354a, 1354b, . . . 1354n etc.), and a TDC or counter 1355 (e.g., 1355a, 1355b, . . . 1355n etc.). Advantageously, by measuring pulse width, the TDC 1355 would provide functionality to the quantity of cells that may be failing during a parallel stressing event.

Referring to FIGS. 14-16, an example operation is shown according to example implementations. The operation may be performed to predict (i.e., forecast) at least partial breakdown of an access device of a bitcell in a memory grouping by inducing at least partial breakdown of a corresponding access device of a canary circuit.

FIG. 14 illustrates a stress phase 1400 according to example implementations on the example circuitry 1300 (with reference to FIG. 13). As illustrated in FIG. 14, in one example, the stress phase 1400 includes an excitation stress (e.g., $V_{BL0}$, $V_{BLN}$) (as described in later paragraphs with reference, e.g., to FIG. 23) provided by the stress driver circuit 1351 (e.g., 1351a, 1351n) on the one or more canary circuit columns 1320 (e.g., 1320a, 1320n) via the bitline (e.g., 1330a, 1330n). Also, a particular wordline voltage (e.g., different wordline voltages: $V_{WL0}$, $V_{WL1}$, . . . $V_{WLN}$) can be provided on the wordlines 1332 (e.g., respective wordlines 1332a, 1332n).

FIGS. 15A-C illustrate a column check and sense phase 1500 according to example implementations on the example circuitry 1300 (with reference to FIG. 13). As illustrated in FIG. 15A, in one example, the column check and sense phase 1500 includes: precharging the bitline 1320 by the precharge circuit 1352 (e.g., 1352*a*, 1352*n*) (i.e., Canary BL Precharge) that is coupled to a respective canary circuit column 1320 (e.g., 1320*a*, 1320*n*) and a respective bitline 1330 (e.g., 1330*a*, 1330*n*). Also, a wordline voltage (e.g., a different wordline voltage $V_{WL0}, V_{WL1}, \ldots V_{WLN}$) may also be provided on the each of the wordlines 1332 (e.g., 1332*a*, 1332*b*, 1332*n*,). By doing so, (similar to as described in FIGS. 6B, 8B, and 9B), as shown in FIG. 15B, on an example graph of voltage over time, a signal response (corresponding to the bitline discharging rate) would vary if there are any broken (i.e., partially broken) access device transistors of canary circuits in the canary circuit column(s) under test. For example, when there is at least one "broken" canary circuit, the discharge rate (e.g., 1382*a*, 1382*n* in FIG. 15B) would be far faster in comparison to when no access device transistors are broken (e.g., 1380*a*, 1380*n* in FIG. 15B).

Next, as illustrated, the signal response on the bitline 1330 (e.g., 1330*n*) would be input to the comparator 1354 (e.g., 1354*a*, 1354*n*) along with a reference voltage $V_{REF}$ provided from a reference voltage generation circuit 1372 (e.g., 1372*a*, 1372*n*). Moreover, as shown in FIGS. 15A and 15C, in certain implementations, the output of the comparator 1354 (e.g., 1354*a*, 1354*n*) may be transmitted to a TDC/counter 1355 (e.g., 1355*a*, 1355*n*) where a digital output signal (e.g., 1392*n*, 1390*n* as shown in FIG. 15C) can provide an estimated count. The TDC/counter 1355 may be programmable based on the particular canary characteristics (depending on memory technology) as well as column height. As one example, if no canary circuit is broken in an example column 1320*n*, the TDC or counter 1355*n* would be guaranteed to be in a known expected range ("T") (e.g., as based on the particular memory technology) (e.g., 1390*n*). Otherwise, if one or more canary circuits of the column 1320*n* are broken, the TDC or counter 1355*n* would be less than the expected range ("0"). Hence, advantageously, an operator would be able to detect a breakdown event of one or more canary circuits per column. Also, as each column may be configured to represent a duration of time until breakdown of a corresponding memory portion, advantageously, such a checking capability allows for a determination of urgency with regards to breakdown.

FIG. 16 illustrates a row-by-row check and sense phase 1600 according to example implementations on the example circuitry 1300 (with reference to FIG. 13 and applicable to FIGS. 17-21 as well). As illustrated in FIG. 16A, in one example, the row check and sense phase 1600 includes: precharging the bitline 1330 by the precharge circuit 1352 (e.g., 1352*a*, 1352*n*) (i.e., Canary BL Precharge) on the one or more canary circuit columns 1320 (e.g., 1320*a*, 1320*n*) that is coupled to the bitline 1330 (e.g., 1330*a*, 1330*n*). In addition, all wordlines voltages are set to zero (e.g., 1332*a*, 1334*b* . . . 1334*n*), except for the particular wordline 1334 being tested (e.g., 1334*a* ($V_{WL0}$), 1334*b* ($V_{WL1}$) . . . 1334*n* ($V_{WLN}$)).

By doing so, (similar to as described in FIGS. 6B, 8B, and 9B), as shown in FIG. 16B, on an example graph of voltage over time, a signal response (corresponding to the bitline discharging rate) would vary if there are any broken (i.e., partially broken) access device transistors of canary circuits in the canary circuit row under test. For example, when there is at least one "broken" canary circuit, the discharge rate (e.g., 1382*a*, 1382*n* in FIG. 16B) would be far faster in comparison to when no access device transistors are broken (e.g., 1380*a*, 1380*n* in FIG. 16B). Next, as illustrated, the signal response on the bitline 1330 (e.g., 1330*n*) on a corresponding column would be input to a corresponding comparator 1354 (e.g., 1354*a*, 1354*n*) along with a reference voltage $V_{REF}$ provided from a reference voltage generation circuit 1372 (e.g., 1372*a*, 1372*n*). Moreover, as shown in FIGS. 16A and 16C, in certain implementations, the output of the comparator (e.g., 1390, 1392) at this stage would provide pin-accuracy as to whether a particular canary access device under test (e.g., by matching of the column and row under test). In one example, if no canary circuit is broken in an example row of canary circuits 1322, 1324, etc., the output of the comparator 1354 (e.g., 1354*a*, 1354*n*) would be in a known expected range (based on a particular memory technology) (e.g., 1390*n*). Otherwise, if one or more canary circuits in an example row of canary circuits 1322, 1324, etc. are broken, the output of the comparator 1354 (e.g., 1354*a*, 1354*n*) would be less than the expected range (e.g., 1392*n*). Hence, advantageously, as the operator would be able to detect a breakdown event of one or more columns and rows of canary circuits, an operator would be able to determine with accuracy and precision where and when corresponding memory will be subject to breakdown.

Referring to FIGS. 17A-17B, a first example detection with the stressing operation 1700 is shown according to example implementations. As illustrated, FIG. 17A depicts voltage transient simulations corresponding to an operation on example canary circuit column implementation with the detection circuitry (e.g., including the precharge circuitry 1750 and the comparator 1760) in FIG. 17B. The example canary circuit column may be as described with any of the implementations as discussed in earlier paragraphs. For instance, in FIG. 17A, in the stress phase itself, on a graph of voltage (0 to 1V) 1802, 1804, 1806 as a function of time (e.g., 0 to 400 ns) 1808: the voltage signal waveform 1710 (at the top) represents a bitline precharge voltage; the voltage signal waveform 1720 (in the middle) represents an analog voltage that is "developed" on the bitline; and the voltage signal waveform 1730 (at the bottom) represents a control gate voltage of all of the transistor devices of the canary column (which would also substantially match the wordline voltage of all the transistor devices of the canary column). At a particular time point 1740, an induced breakdown would occur due to the stressing of the canary column. Prior to the breakdown time point 1740 (on the left portion of FIG. 17A), all canary cells are shown to be operating normally. After the induced breakdown (on the right portion of FIG. 17A), e.g., canary cell 0 (i.e., a first canary cell) is broken due to breakdown, and the comparator 1760 (by a pattern detected at output being a digital "1" or "0") is able to detect a deviation (e.g., margin_a 1745) in the analog voltage signal 1720. Accordingly, the comparison in this first example stress and detect operation 1700: the comparison is of voltage levels where if there was no breakdown (e.g., at least partial breakdown), the voltage level would be zero (as in no voltage level deviation); and where there was breakdown (e.g., at least partial breakdown), the deviation would be margin_a 1745. Advantageously, no additional sensing operation may be required for this general breakdown detection. However, in some instances a TDC or counter may be included at the output of the comparator 1760 similar to other implementations as described herein.

Referring to FIGS. 18A-18B, a second example detection with the stressing operation 1800 is shown according to example implementations. As illustrated, FIG. 18A depicts voltage transient simulations corresponding to an operation on example canary circuit column implementation with the detection circuitry (e.g., including the precharge circuitry 1850 and the comparator 1860) in FIG. 18B. The example canary circuit column may be as described with any of the implementations as discussed in earlier paragraphs. For instance, in FIG. 18A, in the stress phase itself, on a graph of voltage (0 to 1V) 1802, 1804, 1806 as a function of time (e.g., 0 to 400 ns) 1808: the voltage signal waveform 1810 (at the top) represents a bitline precharge voltage; the voltage signal waveform 1820 (in the middle) represents an analog gate voltage pattern that is developed on the bitline when all of the canary cells are accessed with an active wordline voltage (VWL); and the voltage signal waveform 1730 (at the bottom) represents a control gate voltage (VWL) of all of the transistor devices of the canary column (which would also substantially match the wordline voltage of all the transistor devices of the canary column). As a particular time point 1840, an induced breakdown would occur due to the stressing of the canary column. Prior to the breakdown time point 1840 (on the left portion of FIG. 18A), all canary cells are shown to be operating normally. After the induced breakdown (on the right portion of FIG. 18A), e.g., canary cell 0 (i.e., a first canary cell 1872) is broken due to breakdown, and the comparator 1860 (by a pattern detected at output being a digital "1" or "0") is able to detect a deviation (i.e., margin_a 1845) in the analog voltage signal 1820. In contrast to the operation 1700, operation 1800 includes providing a narrow wordline pulses than the operation 1800. In doing so, margin_a 1845 would be enlarged, and likelihood of detection of breakdown would be greater. Accordingly, in this second example stress and detect operation 1800: the comparison is of voltage levels where if there was no breakdown, the voltage level would be the operating voltage ($V_{DD}$) (as in no voltage level deviation); and when there was breakdown, the deviation would be margin_a 1745 subtracted from the operating voltage $V_{DD}$. Hence, in the operation 1800, voltage may be reduced at the bitline, by a conductive path that has been developed b/w the bitline and wordlines. Advantageously, no additional sensing operation may be required for this general breakdown detection. Nevertheless, in some instances a TDC or counter may be included at the output of the comparator 1760 similar to other implementations as described herein.

Referring to FIGS. 19A-19B, a first example stress and follow up sensing operation 1900 is shown according to example implementations. As illustrated, FIG. 19A depicts voltage transient simulations (i.e., voltage waveforms) corresponding to an operation on example canary circuit column implementation in FIG. 19B. The example canary circuit column may be as described with any of the implementations as discussed in earlier paragraphs. For instance, in FIG. 19A, on a graph of voltage (0 to 1V) 1902, 1904, 1906 as a function of time (e.g., 0 to 400 ns) 1908: the voltage signal waveform 1910 (at the top) represents a bitline precharge voltage; the voltage signal waveform 1920 (in the middle) represents an analog gate voltage pattern that is developed on the bitline; and the voltage signal waveform 930 (at the bottom) represents a control gate voltage ($V_{WL}$) of the access transistor devices in canary cells 0 and 1, for example, of the canary column.

In an example operation 1900, initially, a precharge circuit 1950 would provide an initial voltage to the bitline and then would disconnect. Hence, the bitline would be kept at that voltage unless something discharges it. (In contrast to the operation 1900, in operations 1700 and 1800, voltage is provided to bitline continuously and the gates of the canary circuits would absorb the energy and current would flow to it.). At this time, as well, in operation 1900, each of the wordlines that are coupled to the canary column would be all set to 0. Hence, in operation 1900, when the precharge signal 1910 is active, initially, however, the voltage signal 1920 would be low, and the voltage signal 1930 would remain high (even though a canary circuit transistor has not been selected). This would be because the canary circuit transistors are "off" at this point, and thus, there would be no discharging on the bitline. Hence, precharging in this context refers to placing voltage on the bitline, but not "consuming" it (until a canary circuit transistor have been selected). Accordingly, the voltage signal 1920 is kept constant (e.g., at approximately 1V) prior to the induced breakdown.

To explain the operation further, during precharging, only the bitline would be active but the wordlines would not be active. However, during stress phase, both the bitline and the wordlines would be active in order to stress device. As current would have to flow through an example transistor, a voltage potential would be applied between the drain and source terminals, as well as by activation of the respective gate of the transistor through the wordline via the excitation stress. In contrast, during precharge, voltage provided between the drain and source terminals, but since the transistor switch is "off", while the potential is there, no current would through the transistor.

Next, at a particular time interval 1940, an induced breakdown would occur due to the stressing stage of the canary column. Prior to the breakdown time point 1940, the canary cells are shown to be operating normally (on the left portion of FIG. 19A). After the induced breakdown 1940 (on the right portion of FIG. 19A), e.g., canary cell 0 (i.e., a first canary circuit 1972) is shown to breakdown, and the voltage level of the voltage signal 1920 drops by a first deviation (e.g., margin_a 1940). Also, as observed, once the canary cell 0 (1972) is selected (by setting a voltage on the corresponding wordline, while the other canary devices are off), the voltage level of the voltage signal 1920 drops by a larger, second deviation (e.g., margin_b 1945). Advantageously, in the sensing operation, the comparator 1960 (by a pattern detected at output being a digital "1" or "0") is able to detect a particular deviation or a larger/largest deviation (e.g., margin_a 1945, margin_b 1946, or both) in the analog voltage signal 1920. Moreover, in some instances a TDC or counter may also be included at the output of the comparator 1960 similar to other implementations as described herein.

Referring to FIGS. 20A-20B, an example stress and follow up parallel sensing operation 2000 is shown according to example implementations. As illustrated, FIG. 20A depicts voltage transient simulations (i.e., voltage waveforms) corresponding to an operation on example canary circuit column implementation in FIG. 20B. The example canary circuit column may be as described with parallel implementations as discussed in earlier paragraphs. For instance, in FIG. 20A, on a graph of voltage (0 to 1V) 2002, 2004, 2006 as a function of time (e.g., 0 to 400 ns) 2008: the voltage signal waveform 2010 (at the top) represents a bitline precharge voltage; the voltage signal waveform 2020 (in the middle) represents an analog gate voltage pattern that is developed on the bitline; and the voltage signal waveform 2030 (at the bottom) represents a control gate voltage ($V_{WL}$) of the access transistor devices in canary cells 0 and 1, for example, of the canary column.

The example operation 2000 may be substantially similar to the operation 1900, with some specific differences. For instance, with the first stress and then sense option, a mode is available where a test can be in parallel whether all of the canary devices in the same column are operational or at least one was broken (e.g., partially broken). For example, by the addition of the additional selector devices 2080, 2082, the capability to select all or certain transistors would be present. In this parallel case, prior to the induced breakdown 2040 (on the left portion of FIG. 20A), all of the canary circuits may be selected and are determined to be operational. After the breakdown 2040 (on the right portion of FIG. 20A), based on the methodologies discussed in above paragraphs, an operator can identify whether at least one canary circuit has been broken (e.g., if a margin_a 2045 is present indicating a discharge of the bitline voltage). However, to pinpoint which specific canary circuits has suffered breakdown, the operator can proceed to the operation 2100.

Referring to FIGS. 21A-21B, a second example stress and follow up sensing operation 1900 is shown according to example implementations. As illustrated, FIG. 21A depicts voltage transient simulations (i.e., voltage waveforms) corresponding to an operation on example canary circuit column implementation in FIG. 21B. The example canary circuit column may be as described with parallel implementations as discussed in earlier paragraphs. For instance, in FIG. 21A, on a graph of voltage (0 to 1V) 2102, 2104, 2106 as a function of time (e.g., 0 to 400 ns) 2108: the voltage signal waveform 2110 (at the top) represents a bitline precharge voltage; the voltage signal waveform 2120 (in the middle) represents an analog gate voltage pattern that is developed on the bitline and the voltage signal waveform 2130 (at the bottom) represents a control gate voltage ($V_{WL}$) of the access transistor devices in canary cells 0 (2170) and 1 (2172), for example, of the canary column.

In operation 2100, as illustrated, prior to the induced breakdown 2140 (on the left portion of FIG. 21A), canary cell 0 (2170) and canary cell 1 (2172) may be selected and determined to be in normal operation. However, after the induced breakdown 2140 (on the right portion of FIG. 21A), when cell 0 (2170) breaks, cell 0 (2170) itself can be specifically identified, as the deviation of voltage, margin_a 2145 (indicating a discharge of the bitline voltage) would be present. However, with the capability to select between wordlines (by providing zero voltage to all wordlines except for the canary circuit under test (e.g., providing zero voltage to canary circuit 2170, 2172 when under test, otherwise set to zero)), an operator would be able to pinpoint that only canary cell 0 (2170) is at least partially broken and not canary cell 1 (2172).

In the parallel operations, as illustrated in FIGS. 20-21, the discharge of the bitline would occur more rapidly, as there would be current leakage in each of the gates of the canary circuits. However, the operations allow an operator to first detect whether a canary circuit is broken or not (e.g., deviations in voltage signal 2020), and proceed to pinpoint the broken canary circuit(s) (e.g., deviations in voltage signal 2120). Advantageously, both operations 2000 and 2100 provide capability to first perform a stressing operation and then sense in individual and separate stages. As a further advantage, the operations 2000 and 2100, and their corresponding circuit implementations, may also, in some instances, include a TDC at the output of the comparator 1960 similar to other implementations as described herein.

Referring to FIG. 22, a flowchart of an example method 2200 (i.e., procedure) to predict (i.e., forecast) at least partial breakdown of an access device of a bitcell in a memory grouping by inducing at least partial breakdown of a corresponding access device of a canary circuit is shown. Advantageously, in various implementations, the method 2200 depicts the operations modes and method steps for testing one or more canary circuits arranged in rows or columns.

The method 2200 may be implemented with reference to circuit implementations as shown in FIGS. 6-22.

At block 2210, the method includes providing an excitation stress on one or more canary circuits corresponding to a grouping of bitcells in a memory array. For instance, with reference to various implementations as described in FIGS. 6-22, various circuit devices may provide either a voltage stress or current stress (e.g., write-assist or stress assist (by the write or canary bitline stress driver circuit or wordline driver circuits)).

In certain implementations, providing excitation stress comprises controlling (e.g., increasing or decreasing) electrical amplitude or pulse widths of a bitline voltage coupled to the one or more canary circuits, where controlling the electrical amplitude comprises one of: increasing the bitline voltage above a supply voltage, or decreasing the bitline voltage below a ground voltage; and where controlling (e.g., increasing or decreasing) the pulse widths comprises increasing a pulse width of the bitline voltage for a duration longer than a threshold voltage time duration (e.g., a nominal operational voltage of approximately 50 ps); or controlling (e.g., increasing or decreasing) a bitline current for a duration longer than a threshold current time duration (e.g., a nominal operational voltage of approximately 50 ps).

In certain implementations, providing the excitation stress comprises one of: controlling (e.g., increasing or decreasing) electrical amplitude or pulse widths of a wordline voltage coupled to the one or more canary circuits, where controlling (e.g., increasing or decreasing) the electrical amplitude comprises one of: increasing the wordline voltage above a supply voltage, or decreasing the wordline voltage below a ground voltage; and where controlling (e.g., increasing or decreasing) the pulse widths comprises increasing a pulse width of the wordline voltage for a duration longer than a threshold voltage time duration (e.g., a nominal operational voltage of approximately 50 ps); or controlling a wordline current for a duration longer than a threshold current time duration (e.g., a nominal operational voltage of approximately 50 ps).

At block 2220, the method includes detecting at least a partial breakdown of the one or more canary circuits. For instance, as described in FIGS. 6-22, detection circuitry (e.g., precharge circuitry and a comparator) or by a determination or sampling of the bitline voltage (or discharge rate thereof) may detect or sense at least a partial breakdown of the one or more canary circuits.

At block 2230, the method includes generating a flag. For instance, as described with reference to FIGS. 6-22, a flag may be generated by a canary control circuit to trigger a security mechanism. As certain non-limiting examples, the canary control circuit can be configured to: 1) provide an interruption or notification (warning); 2) replicate data in the memory array corresponding to the one or more canary circuits in a different memory array; 3) indicate (mark, designate) a particular grouping of bitcells as malfunctioning; or 4) provide for the memory array to operate at a lower operate voltage.

In one implementation of method 2200, the one or more canary circuits comprises a plurality of canary circuits arranged in columns, where detecting at least a partial breakdown of the one or more canary circuits comprises: determining, by a bitline discharge, a first reference voltage level corresponding to a voltage waveform of one or more unbroken canary circuits; and determining, by the bitline discharge, a voltage deviation of the first reference voltage with a bitline-developed voltage when one or more canary circuits is under test. In one example, the first reference voltage level may be approximately zero or approximately an operating voltage.

In one implementation of method 2200, the method 220 further includes: precharging a bitline voltage coupled to the column of canary circuits, where detecting at least a partial breakdown of each of the one or more canary circuits comprises: setting a wordline voltage of a first canary circuit to a first voltage, setting any other canary circuits of the column of canary circuits to a zero voltage, wherein the first canary circuit is under evaluation; and determining if the first canary circuit is at least partially broken-down based on a discharge of the bitline voltage. In a certain example, the discharge of the bitline voltage comprises a digital comparator output.

In one implementation of method 2200, detecting at least a partial breakdown of each of the one or more canary circuits comprises: precharging a bitline voltage coupled to the column of canary circuits, and where detecting at least a partial breakdown of each of the one or more canary circuits comprises: setting an approximately negative wordline voltage to each canary circuit of the column canary circuits; and determining, by a comparator output, if at least one of the canary circuits is at least partially broken-down based on a discharge of the bitline voltage. In certain examples, the implementation includes selecting, by providing a positive selection voltage, a first canary circuit of the column of canary circuits; setting, any other canary circuits of the column of canary circuits to zero voltage, where the first canary circuit is under evaluation, and determining, by the comparator output, if the first canary circuit is at least partially broken-down based on a discharge of the bitline voltage.

In one implementation of method 2200, detecting at least a partial breakdown of the one or more canary circuits comprises: a single canary circuit evaluation comprising: precharging, by a canary bitline precharge circuit, a bitline voltage coupled to a the one or more canary circuits; setting a wordline voltage of the first canary circuit to a high voltage, and setting each of the other canary circuits of the one or more canary circuits to a low voltage, wherein the first canary circuit is under evaluation; and determining, by a comparator output, if the first canary circuit is at least broken based on a discharge of the bitline voltage.

In one implementation of method 2200, where the one or more canary circuits comprises a plurality of columns of canary circuits, and wherein detecting at least a partial breakdown of the one or more canary circuits comprises: a per column evaluation, wherein each column of the one or more canary circuits is configured to receive a different wordline voltage, and wherein the per column evaluation comprises: precharging, by respective canary bitline precharge circuits, respective bitline voltages coupled to the one or more canary circuits; and receiving, by a time-to-digital converter (TDC), a count indicating a quantity of canary circuit breakdowns per column.

In one implementation of method 2200, where the one or more canary circuits comprises a plurality of rows of canary circuits, and wherein detecting at least a partial breakdown of the one or more canary circuits comprises: a per row evaluation, wherein a first row of the one or more canary circuits is configured to receive a wordline voltage, and wherein each of the other rows of canary circuits are set to approximately zero wordline voltage; the per row evaluation comprising: precharging, by respective canary bitline precharge circuits, respective bitline voltages coupled to the one or more canary circuits; and determining, by a comparator output, if the row is broken based on a discharge of the bitline voltage.

In certain embodiments of the inventive aspects, a circuit includes memory array comprising one or more groupings of bitcells, one or more bitlines, and one or more wordlines; one or more canary circuits coupled to the memory array; and a canary control circuit configured to induce at least partial breakdown of the one or more canary circuits to predict degradation of the memory array. In one implementation, the one or more canary circuits comprise one or more columns of canary circuits, and further comprises: for each column of canary circuits; stress driver circuitry; precharge circuitry; circuitry configured to control a gate signal to select between the stress driver circuit or precharge circuitry based on a control signal; and a comparator. In one implementation, the circuit further comprises: a time-to-digital converter (TDC) or counter, wherein the TDC or counter is programmable based on one or more predetermined canary characteristics and a quantity of the canary circuits. In one implementation, the one or more canary circuits and the canary control circuit are incorporated within the memory array. In another implementation, the one or more canary circuits and the canary control circuit are distinct from the memory array.

FIG. 23 illustrates example hardware components in the computer system 2300 that may be used to implement generate the circuit designs and operations described herein to detect at least partial breakdown of an access device of a bitcell in a memory grouping by inducing at least partial breakdown of a corresponding access device of a canary circuit. In certain implementations, the example computer system 2300 (e.g., networked computer system and/or server) may include circuit design and operations tool 2324) and execute software based on the procedure as described with reference to the method 2200 in FIG. 22, as well as the specific operations and modes as described in FIGS. 6-21.

The circuit design and operations tool 2324 may provide generated computer-aided circuit designs and for memory architecture. The procedure 2200 may be stored as program code as instructions 2317 in the computer readable medium of the storage device 2316 (or alternatively, in memory 2314) that may be executed by the computer 2310, or networked computers 2320, 2330, other networked electronic devices (not shown) or a combination thereof. In certain implementations, each of the computers 2310, 2320, 2330 may be any type of computer, computer system, or other programmable electronic device. Further, each of the computers 2310, 2320, 2330 may be implemented using one or more networked computers, e.g., in a cluster or other distributed computing system.

In certain implementations, the computer system 2300 may be used with semiconductor integrated circuit (IC) designs that contain all standard cells, all blocks or a mixture of standard cells and blocks. In a particular example implementation, the system 2300 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 2300 may be stored in one or more of memory 2314 or storage devices 2316 of computer 2310 or in networked computers 2320, 2320.

The system 2300 may perform the following functions automatically, with variable user input: including providing an excitation stress on one or more canary circuits corresponding to a grouping of bitcells in a memory array; detecting at least a partial breakdown of the one or more canary circuits; and generating a flag (e.g., a failure flag). In some instances, such functions may be performed substantially via user input control. Additionally, such functions can be used in conjunction with the manual capabilities of the system 2300 to produce the target results that are required by a designer/operator.

In one implementation, the computer system 2300 includes processing unit (CPU/GPU/NPU) 2312 having at least one hardware-based processor coupled to a memory 2314. In certain implementations, the processing unit 2312 may include one or more of a central processing unit (CPU), a graphical processing unit (GPU) or a neural processing unit (NPU). The memory 2314 may represent random access memory (RAM) devices of main storage of the computer 2310, supplemental levels of memory (e.g., cache memories, non-volatile or backup memories (e.g., programmable or flash memories)), read-only memories, or combinations thereof. In addition to the memory 2314, the computer system 2300 may include other memory located elsewhere in the computer 2310, such as cache memory in the processing unit 2312, as well as any storage capacity used as a virtual memory (e.g., as stored on a storage device 2316 or on another computer coupled to the computer 2310).

The computer system 2310 may further be configured to communicate information externally. To interface with a user or operator (e.g., a circuit design engineer), the computer 2310 may include a user interface (I/F) 2318 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 2310 may include a network interface (I/F) 2315 which may be coupled to one or more networks 2340 (e.g., a wireless network) to enable communication of information with other computers and electronic devices. The computer 2360 may include analog and/or digital interfaces between the processing unit 2312 and each of the components 2314, 2315, 2316, and 2318. Further, other non-limiting hardware environments may be used within the context of example implementations.

The computer 2310 may operate under the control of an operating system 2326 and may execute or otherwise rely upon various computer software applications, components, programs, objects, modules, data structures, etc. (such as the programs associated with the procedure 2200 and the method 2200 and related software). The operating system 2328 may be stored in the memory 2314. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 2326 in the example of FIG. 23 is shown in the memory 2314, but components of the aforementioned software may also, or in addition, be stored at non-volatile memory (e.g., on storage device 2316 (data storage) and/or the non-volatile memory (not shown). Moreover, various applications, components, programs, objects, modules, etc. may also execute on one or more processors in another computer coupled to the computer 2310 via the network 2340 (e.g., in a distributed or client-server computing environment) where the processing to implement the functions of a computer program may be allocated to multiple computers 2320, 2330 over the network 2340.

In example implementations, circuit diagrams have been provided in FIGS. 6-21, whose redundant description has not been duplicated in the related description of analogous circuit diagrams. It is expressly incorporated that the same circuit diagrams with identical symbols and/or reference numerals are included in each of embodiments based on its corresponding figure(s).

Although one or more of FIGS. 1-23 may illustrate systems, apparatuses, or methods according to the teachings of the disclosure, the disclosure is not limited to these illustrated systems, apparatuses, or methods. One or more functions or components of any of FIGS. 1-23 as illustrated or described herein may be combined with one or more other portions of another of FIGS. 1-23. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 614, the storage device 616, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A circuit comprising:
   a memory array comprising one or more groupings of bitcells, one or more bitlines, and one or more wordlines; and
   one or more canary circuits coupled to the memory array, wherein each of the canary circuits is configured to predict at least partial breakdown of a corresponding grouping of bitcells in the memory array, and
   wherein each of the one or more canary circuits are activated by a substantially similar wordline voltage, wherein the wordline voltage is a negative voltage, wherein an absolute value of the negative voltage is less than a voltage threshold, and wherein the voltage threshold corresponds to a rate of voltage discharge of a bitline to allow a time-to-digital converter (TDC) or counter to detect a breakdown of at least one of the one or more canary circuits.

2. The circuit of claim 1, wherein the one or more canary circuits comprise one or more columns of canary circuits, and wherein each of the one or more columns of canary circuits is configured to predict the at least partial breakdown of the corresponding grouping of bitcells at respective one or more different time intervals in the memory array.

3. The circuit of claim 1, wherein the one or more canary circuits comprise one or more rows of canary circuits, and wherein each of the one or more rows of canary circuits is configured to predict the at least partial breakdown of a corresponding bitcell or one or more rows of bitcells in the memory array.

4. The circuit of claim 1, wherein: the at least partial breakdown comprises a range of the breakdown of the corresponding grouping of bitcells in the memory array, wherein the range of breakdown comprises: a degradation of one or more access devices of at least a portion of the grouping of bitcells, and
   each of the one or more canary circuits is configured to predict the range of the breakdown of respective one or more access devices in bitcells of the portion of the grouping of bitcells.

5. The circuit of claim 4, wherein:
   the range of the degradation comprises: an anticipation of an irreversible short-circuit in one insulating gate oxide of solely one access device in the bitcells to a full breakdown of the grouping of bitcells;
   each of the groupings of bitcells comprises: a memory bank, a memory block, one or more rows of bitcells, or one or more columns of bitcells, or a single bitcell.

6. The circuit of claim 1, wherein each of the one or more canary circuits comprises:
   a first selector device; and
   a load, wherein the load is approximately matched to a corresponding load of the grouping of bitcells.

7. The circuit of claim 6, wherein each of the one or more canary circuits comprises:
   a second selector device coupled in series to the first selector device, wherein the second selector device is configured to control activation of a respective canary circuit and enable decoupling from a respective wordline of the one or more wordlines.

8. The circuit of claim 6, wherein the load comprises a first inverter, and further comprising:
   a second selector device; and
   a second inverter, wherein the first selector device comprises a gate oxide layer with a thickness less than 10 nanometers.

9. The circuit of claim 1, wherein the one or more canary circuits comprise one or more columns of canary circuits, and further comprising:
   for each column of canary circuits:
     stress driver circuitry;
     precharge circuitry;
     circuitry configured to control a gate signal to select between the stress driver circuit or the precharge circuitry based on a control signal; and
     a comparator.

10. The circuit of claim 9, further comprising:
    a time-to-digital converter (TDC) or counter, wherein the TDC or counter is programmable based on one or more predetermined canary characteristics and a quantity of the canary circuits.

11. The circuit of claim 1, further comprising:
    a canary control circuit configured to:
      transmit one or more control signals to: activate respective write driver circuits or precharge circuits of one or more columns or rows of the canary circuits;
      detect a discharge voltage of the one or more bitlines; or
      receive an output signal, from one or more: comparators, a time-to-digital converter (TDC), or counters, wherein the output signal corresponds to the partial breakdown of one or more canary circuits.

12. The circuit of claim 11, wherein the canary control circuit is configured to:
    generate a flag, wherein the flag corresponds to:
      providing an interruption or notification;
      replicating data in the memory array corresponding to the one or more canary circuits in a different memory array;
      indicating a particular grouping of bitcells as malfunctioning; or
      providing for the memory array to operate at a lower operate voltage.

13. The circuit of claim 1, wherein each column of the one or more canary circuits is configured to detect failure of the corresponding grouping of bitcells at a respective different time interval.

14. The circuit of claim 1, wherein:
    respective columns of the two or more canary circuits are configured to detect the at least partial breakdown for respective different time intervals; and
    each different voltage provided to the respective columns corresponds to the respective different time intervals.

15. The circuit of claim 1, wherein:
    the memory array comprises an SRAM or a DRAM; or
    the memory array comprises non-volatile memory, and wherein the non-volatile memory comprises one of flash memory, ferroelectric random-access memory (FeRAM), magnetic random-access memory (MRAM), phase-change memory (PCM), and resistive random-access memory (RRAM).

16. A method comprising:
  providing an excitation stress on one or more canary circuits corresponding to a grouping of bitcells in a memory array, wherein providing the excitation stress comprises one of: controlling electrical amplitude or pulse widths of a bitline voltage or a wordline voltage coupled to the one or more canary circuits;
  detecting at least a partial breakdown of the one or more canary circuits; and
  generating a flag.

17. The method of claim 16, wherein the bitline voltage is controlled, wherein:
  controlling the electrical amplitude comprises one of:
    increasing the bitline voltage above a supply voltage, or
    decreasing the bitline voltage below a ground voltage; and wherein;
  controlling the pulse widths comprises increasing a pulse width of the bitline voltage for a duration longer than a threshold voltage time duration; or
  controlling a bitline current for a duration longer than a threshold current time duration.

18. The method of claim 16, wherein the wordline voltage is controlled, wherein:
  controlling the electrical amplitude comprises one of:
    increasing the wordline voltage above a supply voltage, or
    decreasing the wordline voltage below a ground voltage; and wherein:
  controlling the pulse widths comprises increasing a pulse width of the wordline voltage for a duration longer than a threshold voltage time duration; or
  controlling a wordline current for a duration longer than a threshold current time duration.

19. A circuit comprising:
  a memory array comprising one or more groupings of bitcells, one or more bitlines, and one or more wordlines;
  one or more canary circuits coupled to the memory array; and
  a canary control circuit configured to induce at least partial breakdown of the one or more canary circuits to predict degradation of the memory array.

* * * * *